US007696496B2

(12) United States Patent
Tomimatsu et al.

(10) Patent No.: US 7,696,496 B2
(45) Date of Patent: Apr. 13, 2010

(54) APPARATUS FOR ION BEAM FABRICATION

(75) Inventors: Satoshi Tomimatsu, Kokubunji (JP); Hiroyasu Shichi, Tokyo (JP); Noriyuki Kaneoka, Hitachinaka (JP); Kaoru Umemura, Tokyo (JP); Koji Ishiguro, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 213 days.

(21) Appl. No.: 12/003,207

(22) Filed: Dec. 20, 2007

(65) Prior Publication Data

US 2008/0283778 A1 Nov. 20, 2008

(30) Foreign Application Priority Data

Jan. 17, 2007 (JP) ............................. 2007-008063

(51) Int. Cl.
*H01J 37/317* (2006.01)
(52) U.S. Cl. .................... 250/492.21; 250/309
(58) Field of Classification Search ............ 250/492.21, 250/309
See application file for complete search history.

(56) References Cited

U.S. PATENT DOCUMENTS

| 5,932,884 | A | * | 8/1999 | Aizaki ................. 250/492.23 |
| 5,969,355 | A | * | 10/1999 | Fujii et al. .................. 250/309 |
| 6,313,474 | B1 | | 11/2001 | Iwasawa et al. |
| 6,583,426 | B1 | | 6/2003 | Kawanami et al. |
| 7,122,809 | B2 | * | 10/2006 | Ogasawara ............ 250/492.22 |

FOREIGN PATENT DOCUMENTS

| JP | 3542140 | 9/1997 |
| JP | 3567749 | 7/1998 |

* cited by examiner

*Primary Examiner*—Kiet T Nguyen
(74) *Attorney, Agent, or Firm*—Stites & Harbison, PLLC; Juan Carlos A. Marquez, Esq.

(57) ABSTRACT

The apparatus for ion beam fabrication, which has been able to detect any anomalous condition of ion beams only by means of the current irradiated on the specimen, could not compensate the failure by investigating the cause and could not realize stable processing. To solve the problem described above, the present invention includes the first and second blankers and Faraday cups switches ON and OFF the first and second blankers and monitors beam current at two positions above and below the projection mask. By adopting this configuration, it will be possible to acquire the information on failure in ion beam, sort out the cause of the failure and to compensate the failure while limiting damages to the projection mask. As a result, it will be possible to realize stable processing by means of ion beam, and to use the ion beam fabricating device on a stable basis.

16 Claims, 17 Drawing Sheets

FIG. 2A
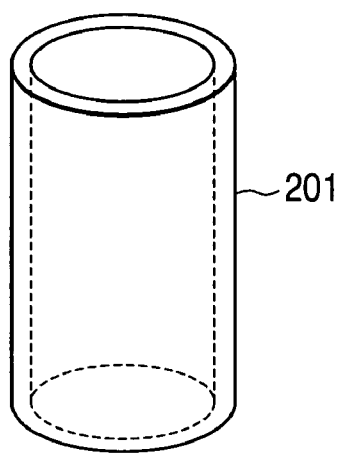
FIG. 2B
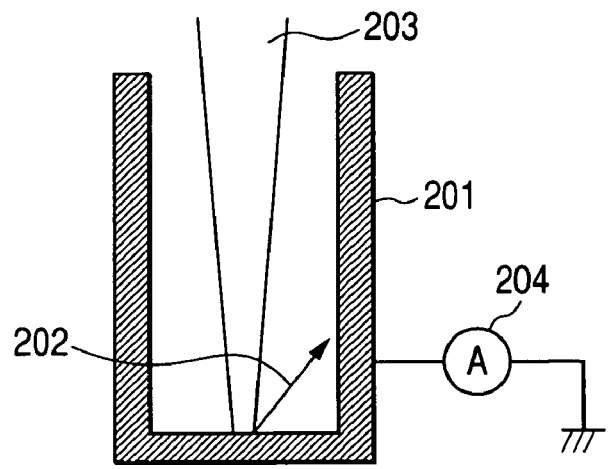
FIG. 2C
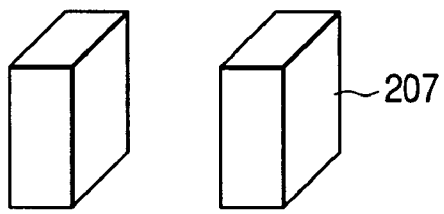
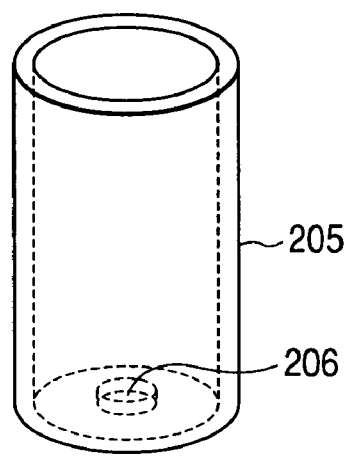
FIG. 2D
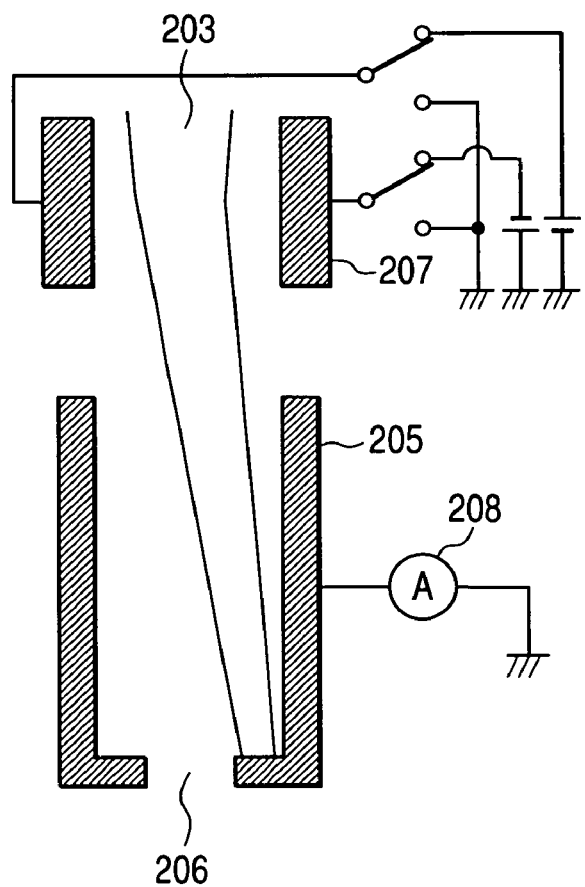

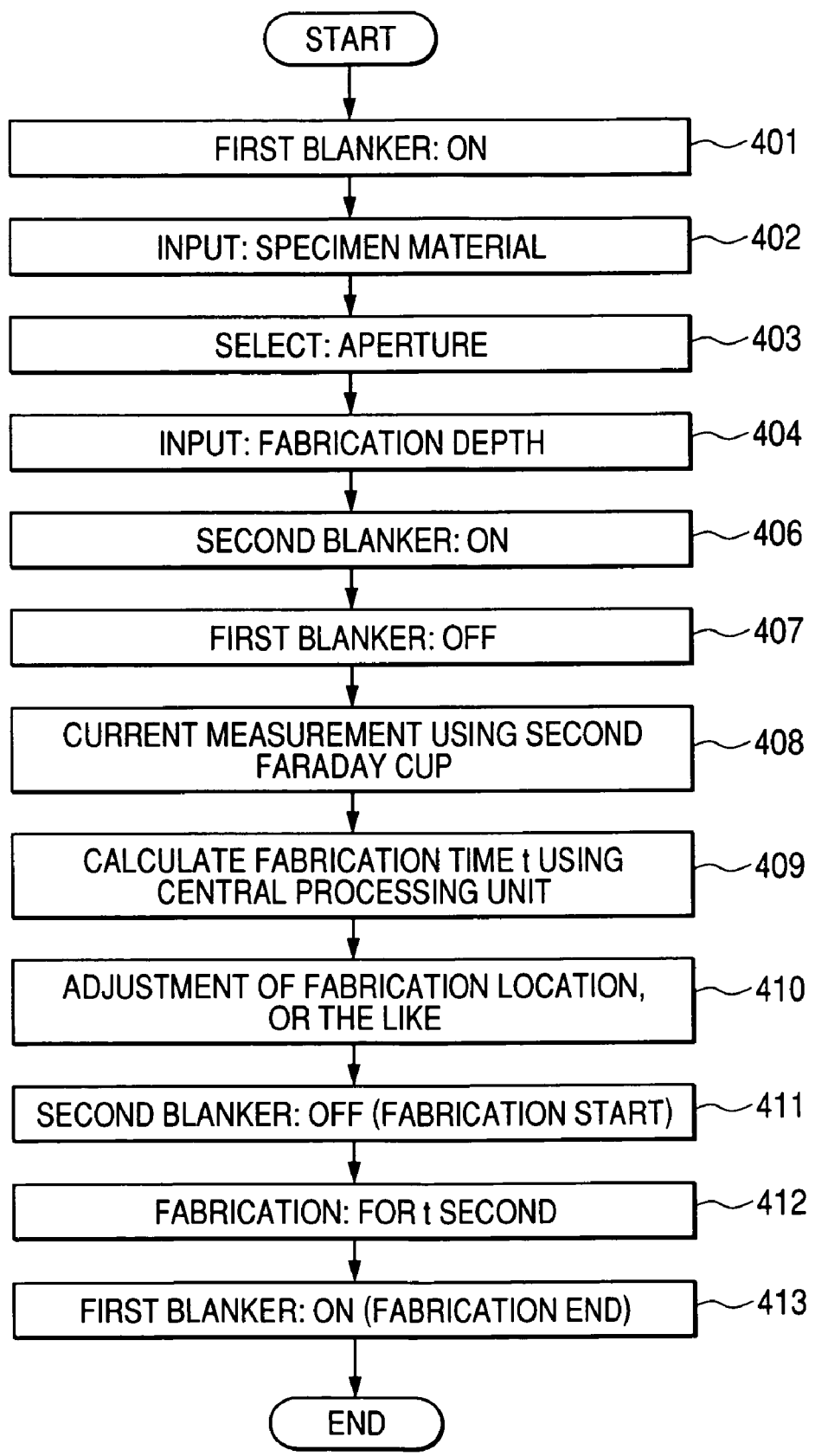

APPARATUS FOR ION BEAM FABRICATION

CLAIM OF PROPERTY

The present application claims priority from Japanese application JP 2007-008063 filed on Jan. 17, 2007, the content of which is hereby incorporated by reference into this application.

FIELD OF THE INVENTION

The present invention relates to an apparatus for ion beam fabrication for manufacturing specimens used in tests and failure analyses of devices and the like.

BACKGROUND OF THE INVENTION

The needs are rising for tests and analyses of semiconductor devices that are becoming progressively minute. In failure analyses for specifying the cause of failure, in particular, the direct observation of defects within devices has become an indispensable technology. For these observations, it is necessary to precisely microfabricate the position of observation objects of the device. So far, this precise miocrofabrication has been carried out by means of a tool called "focused ion beam (hereinafter referred to as "FIB") processing device." As this FIB enables to work precisely on the target position by irradiating the specimen with ion beam focused to the submicron order and electrostatically deflecting the same, this is used for shaping the section for analysis and for fabricating specimens for analysis.

And in this failure analysis processing, the needs are rising for fabricating specimens for analysis in a short period of time. As an improvement in yield is directly connected with the device cost, the identification of the cause of the failure in a short period of time will have a great impact on the reduction of cost. Therefore, a rapid processing of specimens for analysis is expected. As a processing device for realizing this, there is, for example, a projection ion beam (hereinafter referred to as "PJIB") processing device described in JP-B No. 3542140. Unlike the FIB processing device described above that processes to shape the intended form by focusing, deflecting ion beams and scanning the specimen with the same, this device enables to process the specimens in block by projecting mask patterns of shapes similar to the intended shapes predetermined in advance on the specimen. The processing speed is determined roughly by how much ions are irradiated on the area to be processed. In other words, the larger the ion beam current is, higher the processing speed rises. In terms of simple ion beam current density in the ion diameter, the FIB is greater than the PJIB. However, in the processing of an area where the PJIB ion beam current is greater than the FIB ion beam current, the PJIB processing is simply faster. In fact, in the case of processing used for the failure analysis of devices, there is hardly any processing in the submicron range, and in most cases processing in the range of several to several tens of microns is required. And in such cases, the PJIB processing has the merit of being faster.

Since the analyses of failures by using these apparatus for ion beam fabrications were often conducted in the past by specialized operators, even if an anomalous event has occurred in the device, it was possible to cope with such an event by the skill of the operators. Lately however, devices capable of automatically processing without the attendance of any specialized operator have increased. As a result, it has become important to secure the stability of beams in particular in these devices. In order to secure stability of beams, it is effective to monitor beams. For example, JP-B No. 3567749 describes an example of the method of monitoring beam current by an ion implantation equipment. This describes the method of measuring the distribution of current at two points before and after the item processed by means of multipoint Faraday cups, and interpolating or extrapolating the current density distribution of ion beams at the position of the processed item (specimen). It also states that, in view of such a presumed current density distribution, the distribution of beams can be compensated by for example extending the scanning irradiation time in an area with a low current density and by curtailing the scanning irradiation time in an area with a high current density.

SUMMARY OF THE INVENTION

The technology disclosed in JP-B No. 3567749 is effective in the case of minute distribution or variations that can be compensated by beam scanning. Accordingly, in the case of FIB, we believe that there are cases where it is possible to compensate. In the case of PJIB, however, since generally no scanning is made and only the mask shape is projected, it is impossible to compensate by changing the scanning speed.

And there are cases where beams have grown seriously anomalous and no compensation can be made by changing the scanning speed. For example, if the beam has deviated from the center of optical axis by some circumstance, the beam profile itself has been broken, and the beam skirt grows large causing the processing shape to collapse. And since ion beams cause damages to the constituent elements exposed to the irradiation of the beam in the optical system, this can implicate the service life of the constituent elements. In this case also, it is impossible to compensate in the conventional cases mentioned above.

A case wherein the service life of constituent elements is implicated is the PJIB projection mask. Since a projection mask has a function of selectively allowing the passage of only the ion beams used for processing specimens, the ion beams barred from passing through are damaged by the spattering of the projection mask itself. However, since PJIB determines the processing shape of the specimen with its mask pattern shape, it is necessary to ensure that the mask pattern does not break up. In order to elongate this service life, a solution is to thicken the mask so that it may last longer when it is spattered. However, thickening brings about a problem in that delicate patterns cannot be shaped because of the problem of processing aspect. For example, when you want to form a 10 μm wide pattern on a mask, the adoption of a 1 mm thick mask will result in a processing aspect ratio of 100 and it will be difficult to make a mask. Consequently, the thickness of mask due to the shaping pattern size is generally limited by an upper limit, which is for example approximately 300 μm. In this way, on the premise that every mask has a service life, it is necessary to provide a function of preventing any processing failure due to this problem.

We have described above by taking the PJIB projection mask as an example, and in the case of FIB, generally the device includes a movable aperture diaphragm having a plurality of apertures of different sizes for switching beam current. In this case also, there is a problem of service life because, like the projection mask, the movable aperture diaphragm is spattered by illumination beam. If the quantity of beam current irradiated on the specimen has increased due to the movable aperture diaphragm having reached its service life and the diameter of the aperture has grown large, not only the beam current increases but the beam skirt and other factors of the beam profile itself can be broken. In this case, it is impossible to compensate the beam irradiation condition on a specimen by simply compensating the beam irradiation time as in the conventional case. Particularly in the case of a FIB device used for miocrofabrication beam skirt leads fatally to processing failures, and it is important therefore to prevent it from being used under such anomalous conditions.

It is therefore important to provide an ion beam fabrication apparatus capable of monitoring whether the ion beams are normal or anomalous, of compensating any failure if any, or of identifying the cause of the failure if it is impossible to compensate, or of preventing the ion beam fabrication apparatus from being used under any anomalous condition.

In order to solve these problems, the present invention is an apparatus for ion beam fabrication including a specimen stage for holding a specimen, an ion source for generating ion beams, a plate member having an aperture, an irradiation optical system for irradiating ion beams having passed the aperture on a specimen held by the specimen stage, a blanker and a beam current detector on the ion source side of the aperture, wherein the blanker is switched ON to monitor current with the beam current detector when it is not necessary to irradiate the specimen with ion beams.

And it is also an apparatus for ion beam fabrication including a specimen stage for holding a specimen, an ion source for generating ion beams, a plate member having an aperture, an irradiation optical system for irradiating ion beams having passed the aperture on a specimen held by the specimen stage, a first blanker and a first beam current detector on the ion source side of the aperture, and a second blanker and a second beam current detector on the specimen side of the aperture, wherein the first blanker is switched ON to monitor current with the first beam current detector when it is not necessary to irradiate the specimen with ion beams, and the first blanker is switched OFF and the second blanker is switched ON to monitor current with the second beam current detector immediately before irradiating the specimen with ion beams.

The present invention enables to realize the stable operation of the apparatus for ion beam fabrication and to carry out highly reliable failure analyses, and contributes to improve yield of semiconductor processes. In particular, due to the presence of a blanker and a beam current detector on the ion source side of the aperture, it is possible to monitor the stability of the beam current itself irradiated on the aperture while limiting damages to the projection mask and the like that are plate members with an aperture, and therefore it is possible to grasp any anomalies on the ion source side from the aperture. In addition, due to the provision of the second blanker and the second beam current detector on the specimen side of the aperture, it is possible to monitor the detailed condition of the ion beams in cooperation with the first blanker and the first beam current detector, and to monitor the stability of ion beams used for processing of the apparatus for ion beam fabrication while restricting the damages on projection masks and the like that are plate members having an aperture.

BRIEF DESCRIPTION OF DRAWINGS

FIG. 2A, FIG. 2B, FIG. 2C, and FIG. 2D show the Faraday cup and blanker according to the First Embodiment;

FIG. 4 is a drawing showing an example of processing flow according to the First Embodiment;

DETAILED DESCRIPTION OF THE PREFERRED EMBODIMENTS

We will describe below the specific embodiments of an apparatus for ion beam fabrication and processing method capable of realizing a stable operation by monitoring ion beams and compensations based thereon and the identification of the cause of any failure with reference to drawings.

First Embodiment

In the present embodiment, we will describe the configuration of the PJIB device according to the present invention.

Figure 1:
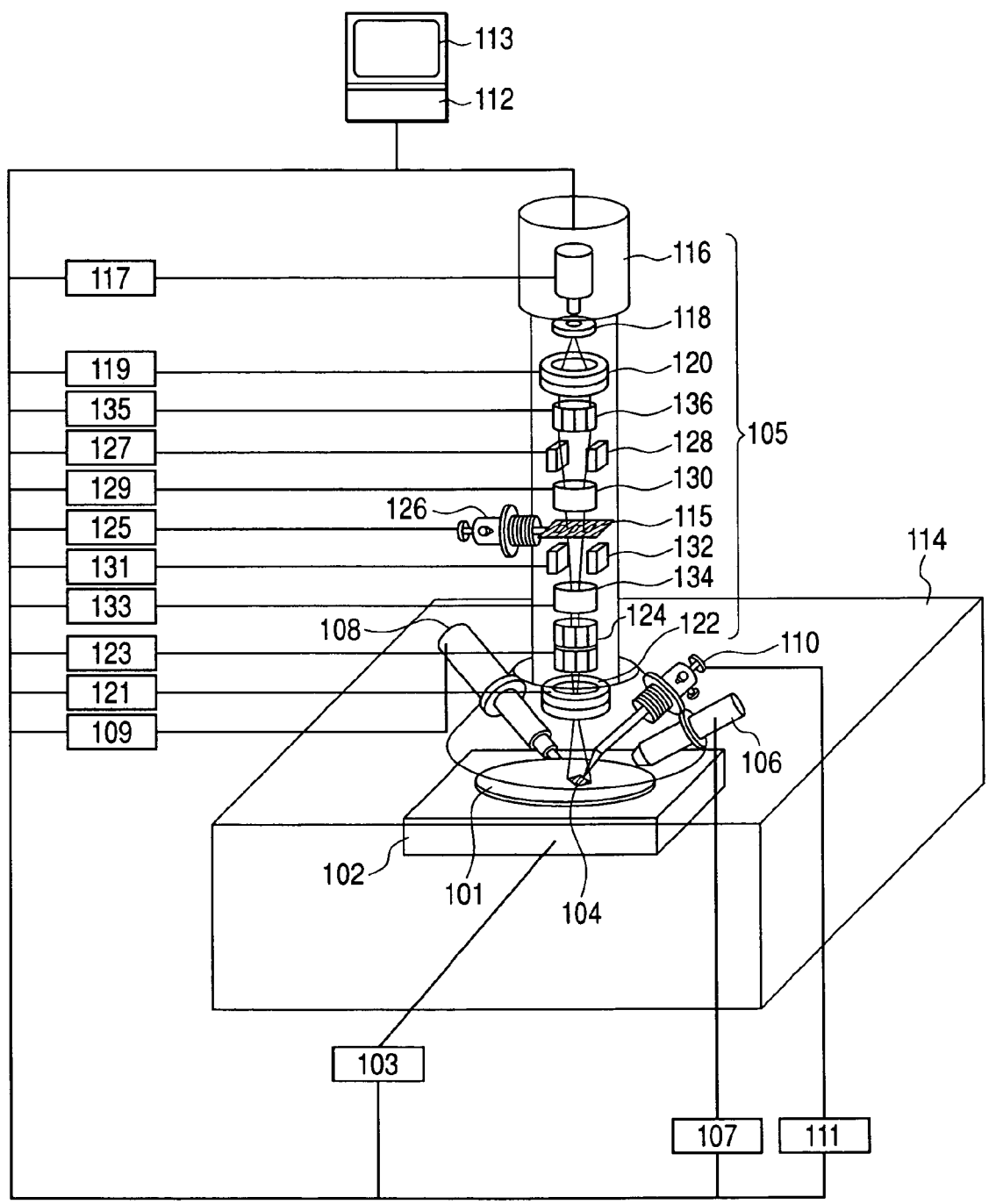
FIG. 1 is a drawing showing an example of the configuration of the PJIB device according to the First Embodiment of the present invention.

The PJIB device shown in FIG. 1 includes a movable specimen stage 102 for carrying the substrate of a specimen 101 such as a semiconductor wafer and the like, a specimen-stage position controller 103 for controlling the position of the specimen stage 102 for identifying the observation and processing position of the specimen 101, an ion-beam irradiating optical system 105 for processing the specimen 101 by irradiating the same with ion beams 104, and a secondary-electron detector 106 for detecting the secondary electrons emitted by the specimen 101. The secondary-electron detector 106 is controlled by a controller for secondary-electron detector 107. An assisting gas supplying source 108 for supplying the assist gas used for the ion beam assist deposition or the ion beam assist etching is controlled by a controller for assisting gas supplying source 109. And a probe 110 for extracting specimens and for measuring their electric characteristics is controlled by a probe controller 111.

The controller for secondary-electron detector 107, the controller for assisting gas supplying source 109, the specimen-stage position controller 103, the probe controller 111 and the controller for various constituent elements of the ion-beam irradiating optical system 105 described further below and the like are controlled by the central processing unit 112. For the central processing unit 112 mentioned here, for example, a personal computer, a workstation or the like is generally used. It has a monitor 113. The specimen stage 102, the ion-beam irradiating optical system 105, the secondary-electron detector 106, the assisting gas supplying source 108 and the like are disposed in a vacuum chamber 114. The ion beams 104 formed in the ion-beam irradiating optical system 105 according to this configuration are irradiated on the specimen 101 placed on the specimen stage 102 for processing. In this embodiment, the form of the ion beam 104 is determined by the form of aperture created in the projection mask 115.

We will then describe in details the ion-beam irradiating optical system 105. Ion is generated by an ion source 116, which is controlled by an ion source controller 117. In this embodiment, the case wherein a plasma ion source is adopted is shown. As plasma ion source, a variety of ion sources such as duoplasmatron, inductively-coupled plasma ion source, Penning ion source, multicusp ion source and the like can be used. These plasma ion sources are mainly used as the ion source for gas materials such as oxygen, nitrogen, rare gas, and the like. As the ion source of gas materials other than the plasma ion sources, electrolytic ionized ion sources and the like are also used. And liquid metal ion sources and the like are also used as the ion source of metals and the like materials, and a variety of ion sources can be used for this device.

Ions are extracted as ion beams through an extractor 118. Extracted ion beams are irradiated on a projection mask 115 through a projection lens 120 controlled by an illumination lens power source 119. The ion beams having passed the projection mask are projected onto a specimen 101 by a projection lens 122 controlled by a projection lens power source 121. By this, the specimen will be processed in the form of the projection mask 115 reduced by a reduction ratio determined by the condition of the projection lens 122. Here, the projection position, in other words, the irradiation position of the ion beam 104 on the specimen is determined by the main deflector 124 controlled by the main deflector controller 123. For the main deflector 124, generally an electrostatic deflector capable of easily deflecting ions is often used.

Said projection mask 115 is generally constituted by a plate member having a plurality of pattern apertures, and the aperture is chosen by displacing the projection mask 115. For this displacement, a mechanism of enabling the choice of intended aperture by sliding the mask 115 inplane along an axis or two axes driven by a projection mask driver 126 controlled by a projection mask controller 125 is used. The projection mask 115 has micro apertures (pinhole apertures) for observation other than such pattern apertures for processing. By this mechanism, it is possible to obtain scanning ion microscopy images (hereinafter referred to as "SIM images") on the surface of the specimen 101 by projecting micro apertures on the surface of the specimen and scanning with the main deflector 124, detecting the secondary electrons generated as a result of the scanning with a secondary-electron detector 106, and taking them as contrast signals and converting the same into images displayed on the monitor 113. In this case, the image resolution is determined by the magnitude of micro apertures of the projection mask 115, and the smaller the aperture is, the higher the resolution rises. However, when it is smaller, the ion current will decrease, and S/N will get worse.

Now, the optical system includes blankers and Faraday cups for monitoring ion beam current. FIGS. 2A to 2D show its configuration. The Faraday cup 201 is generally cylindrical in shape and is made of a conductive material shown in FIG. 2A. The principle of measurement is as follows. The irradiation of electrically charged ion beams on a conductive member results in the flow of a current corresponding to their electric charge, and it will be possible to measure the current by connecting an ammeter to this conductive member. However, an irradiation of the conductive member with ion beams is followed by the emission of secondary electrons of an amount dependent on the material of the conductive member, the mass of ion beams, energy and the like from the conductive member. Since this amount of secondary electrons is measured by an ammeter connected with the conductive member, the precise amount of ion beam irradiation cannot be measured. However, in view of the possibility to use a plate conductive member as a monitor, although it may not be precise, to measure the approximate amount of ion beam current, it is possible to use the same as a low-cost current monitor mechanism. On the other hand, a deep-hole structure designed in a shape from which secondary electrons 202 cannot escape as shown in FIG. 2A and the sectional view of the same FIG. 2B is a Faraday cup, wherein the precise amount of irradiation of ion beam 203 can be measured by an ammeter 204. A Faraday cup designed only for measuring current can do its work perfectly well only if it has a closed bottom. However, it must be structurally designed to be able to irradiate specimen with ion beams if it is to measure current within the optical system. Therefore, a structural design enabling to measure current and to allow the passage of ion beams is desirable. A possible solution is to insert mechanically a Faraday cup with closed bottom as shown in FIG. 2A in the ion-beam optical axis at the time of measurement and to remove the same from the optical axis at the time of irradiation of the specimen. However, in this case, since this involves mechanical movements within the optical system and may generate dusts, this structure is generally used in combination with a blanker shown in FIG. 2C and the sectional view of the same FIG. 2D. At the bottom of the Faraday cup 205, a pinhole aperture 206 is formed for allowing the passage of ion beams. A blanker 207 is often constituted by two opposite electrodes. For irradiating a specimen with ion beams, both electrodes of the blanker 207 are kept in the same potential (generally the ground potential in many cases. This is referred to hereinafter as "switching OFF the blanker") so that the ion beams 203 may not be deflected, and may be irradiated through the hole of the Faraday cup 203. For measuring ion beam current, on the other hand, different voltages are applied on both electrodes of the blanker 207 (hereinafter referred to as "switching ON the blanker") so that the ion beam 203 may be deviated from the central axis by the electrostatic force and the ion beam 203 may be irradiated on the bottom of the Faraday cup 205. This arrangement enables to measure the ion beam current by means of the ammeter 208 connected with the Faraday cup 205. And as the action of switching ON of the blanker 207 leads to the ion beam 203 being blocked at the bottom of the Faraday cup 205, the blanker 207 can play the role of a shield at the same time. The pinhole aperture 206 at the bottom of the Faraday cup 205 has generally a diameter of approximately 1 mm which is larger than the aperture of the projection mask 115 and therefore is not subject to the limit of thickness as that of the projection mask mentioned in the Summary of the Invention. Consequently, its service life generally plays a major role in the determination of its thickness. However, the fact that it is always damaged by spattering is a clear indication that it is a consumable. Accordingly, it is possible to extend its service life by reversing the polarity of voltage applied on both electrodes of the blanker 207 so that the ion beam 203 may be deflected in the opposite direction or by adopting multiple electrodes in place of two opposite electrodes so that the ion beam 203 may be deflected towards different positions of the Faraday cup 205.

Figure 3A:
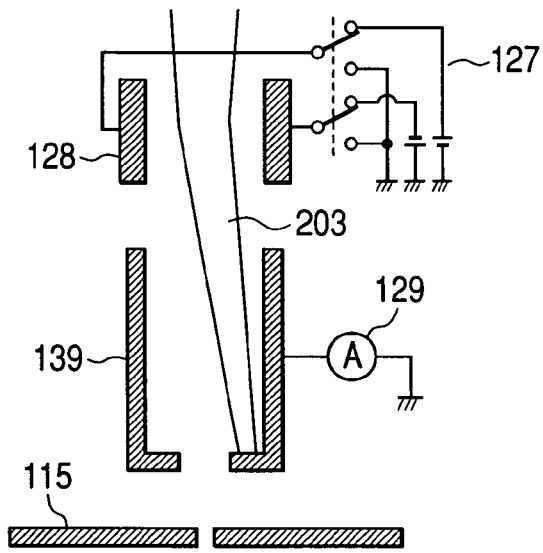
FIG. 3A and FIG. 3B show an operating example of the 2-stage blanker and Faraday cup according to the First Embodiment.

FIG. 1 includes a first blanker 128 controlled by a first blanker controller 127 and a first Faraday cup 130 to which a first Faraday cup ammeter 129 is connected disposed above the projection mask 115 (on the ion source 116 side). As shown in FIG. 3A, this configuration enables to switch ON the first blanker 128 when the specimen 101 is not irradiated with the ion beam so that the projection mask 115 may not be irradiated. Since this arrangement enables to prevent the projection mask 115 from being damaged due to a spattering resulting from the irradiation of the ion beam, it is possible to use the projection mask 115 for a longer service life as compared with the case wherein the projection mask 115 is always irradiated with the ion beam. And this configuration enables to monitor the ion beam current even when the specimen 101 and the projection mask 115 are not irradiated with ion beams. In this way, the value of the ion beam current prevailing during normal operation may be stored in the central processing unit 112, and any deviation from this normal value more than a predetermined ratio, for example 20 percent, can be judged as a failure. We will describe later on the measures to be taken in case of a failure.

Figure 3B:
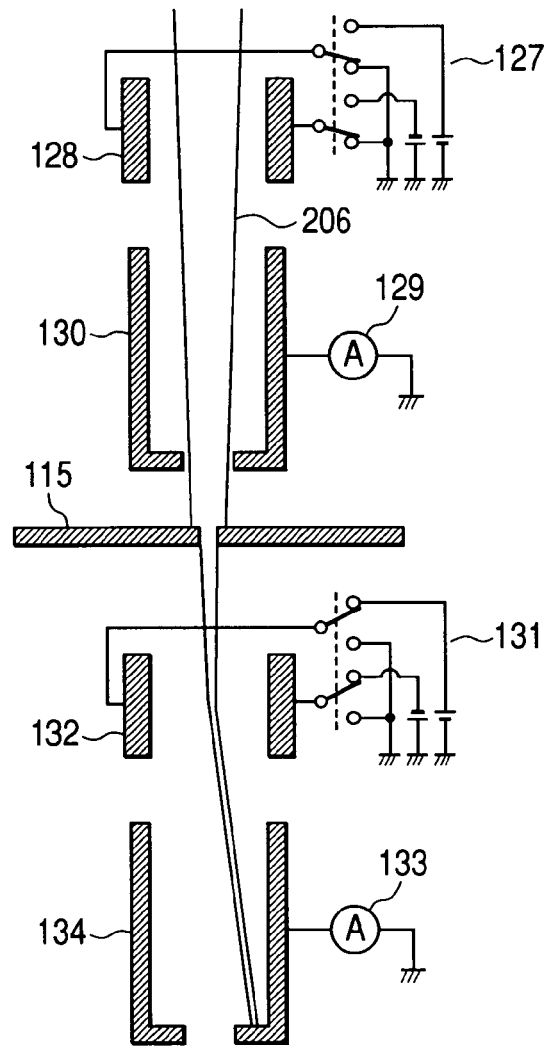

It is possible to monitor the current on the projection mask 115 by means of the first blanker 128 and the first Faraday cup 130 mentioned above. As the ion beam current actually used for processing specimens is the ion beam that has passed through the projection mask 115, for determining the processing conditions, it is better to monitor the ion beam current that has passed through this projection mask 115. For this reason, a second blanker 132 controlled by a second blanker controller 131 and a second Faraday cup 134 connected with a second Faraday cup ammeter 133 are provided below the projection mask 115 (on the specimen 101 side). As FIG. 3B shows, this configuration enables to measure the ion beam current that has passed through the projection mask 115 like the case of the first blanker 128 and that of the Faraday cup 130. Obviously, it is needless to say that, in the case of monitoring ion beam current by means of the second Faraday cup, the first blanker 128 is switched OFF. And for examining the position of irradiating the projection mask 115 with ion beams, a deflector 136 controlled by a deflector controller 135 is provided between the ion source 116 and the projection mask 115. As the deflector 136 like the main deflector 124, an electrostatic deflector that can easily deflect ion is generally used.

Now, the area of the aperture used for processing in the projection mask 115 and the projection magnification (reduction ratio) on the specimen 101 are determined as known values. To describe in more details, if the projection lens 122 is a single-stage lens as shown in FIG. 1, the distance between the projection mask 115 and the projection lens 122 as well as the distance between the projection lens 122 and the surface of the specimen 101 are automatically determined, and as a result the condition of applying voltage on the projection lens 122 is primarily determined, and consequently the projection magnification is also primarily determined. If a plurality of projection lenses are used for a multistage projection, the projection magnification is not primarily determined only by mechanical configuration such as the distance between the projection mask 115 and the projection lens. However, the reduction ratio can be determined by fixing the condition for applying voltage on the multistage projection lens. Taking into account the use of actual device, basically the shape (area) to be processed on the specimen 101 is determined as the needs, the reduction ratio is determined and the aperture of the projection mask 115 required for the same is designed, upon which the projection mask 115 is generally fabricated. Therefore, the reduction ratio is essentially determined in most cases at the setting stage of the device. In this embodiment, for example, this projection magnification is set at 1/10. In other words, when it is desired to process for a length of 10 μm on a specimen 101, the aperture of the projection mask 115 will be 100 μm long (in the case of non-scanning processing).

And the processing volume of a specimen 101 to the ion beam current is determined as described below. The ion spattering ratio showing how many atoms in a specimen are spattered when an ion penetrates in the specimen is determined by the type of the primary ion, the acceleration energy of the primary ion, the material constituting the specimen, the incident angle of the ion beam to the specimen surface and the like. Since the parameters described above, if known, determine the ion spattering ratio, it is possible to calculate processing volume per unit time from the ion beam current value. Therefore, once the desired processing depth is determined, it is possible to calculate the time for processing, in other words the time of irradiating the specimen with ion beams. In specific terms, the following calculation applies to this case. In the first place, the volume to be processed is expressed by the following (Formula 1):

$$V = I_{b2} R t \qquad \text{(Formula 1)}$$

wherein $V[m^3]$ represents the volume of processing, $Ib2[A]$ represents the ion beam current measured by the second Faraday cup 134, $t[s]$ represents the processing time, and $R[m^3/C]$ represents the processing volume per unit electric charge, which is expressed as indicated below (Formula 2).

$$R = \frac{S \cdot W \cdot u}{e \cdot d} \qquad \text{(Formula 2)}$$

where, S represents the spattering ratio mentioned above, W represents the atomic weight of the constituent element of the specimen, $u(=1.66E-27[kg])$ represents the atomic weight unit, $e(=1.66E-19[C])$ represents the elementary electric charge, and $d[kg/m^3]$ represents the density of the constituent elements of the specimen. And the volume V represents the relationship with the aperture area of the projection mask which is expressed as follows:

$$V = A \cdot M^2 \cdot D \qquad \text{(Formula 3)}$$

where $A[m2]$ represents the aperture area of the projection mask, M represents the magnification, and $D[m]$ represents the processing depth. In other words, the processing time t is expressed by the following formula (Formula 4).

$$t = \frac{e \cdot M^2}{u} \cdot \frac{d}{W \cdot S} \cdot (A \cdot D) \cdot \frac{1}{I_{b2}}$$ (Formula 4)

wherein the first term (e M2/u) of multiplication takes a value determined for the configuration of the apparatus. The second term of multiplication (d/W·S) takes a value determined by the specimen material, and the third term of the multiplication takes a value determined from the desired shape to realize by processing. As a result, these values become self-evident at the time of setting the processing parameters. Since the last term $(I/I_{bs})$ takes a value determined by the monitor current, the processing time can be automatically calculated from this monitored current.

The outline of the processing flow in this embodiment is shown in FIG. 4. When the specimen 101 is not irradiated with ion beams as described above, the first blanker 128 is switched ON to separate the specimen from the ion beam (401). The predetermined value $(e \cdot M^2/u)$ is inputted at first in the central processing unit 112. However, when a multiple projection lens is used so that the projection magnification M may be variable, this will also be a parameter. Then the material of the specimen to be processed is set (402). For this operation, it is preferable to register the (d/(W·S)) of materials having a probability of being used in advance and to choose the material from among them by means of a pulldown menu so that the (d/(W·S)) may be automatically set. Then, the shape for processing is selected from among a plurality of apertures (403). The aperture area of this projection mask 115 is registered in advance in the central processing unit, 112 and the chosen aperture area is automatically inputted to substitute A. And the processing depth may be specified by the user, or a pattern may be made for each aperture in advance and the value corresponding to the chosen aperture may be inputted (404). After the setting mentioned above is completed, the second blanker 132 is switched ON (406). And by switching OFF the first blanker 128 (407) so that the projection mask 115 may be irradiated with ion beams, it is possible to measure the ion beam current $I_{b2}$ immediately before the irradiation of the specimen for processing by the second Faraday cup 134 (408). By substituting the ion beam current $I_{b2}$ immediately before the irradiation of ion beam for (the Formula 4), the processing time t can be calculated (409).

Then, processing position and the like are set by adjusting deflection voltage and the like (410). Actual processing is started by switching OFF the second blanker 132 (411), the processing can be stopped by switching ON the first blanker 128 t seconds later (412, 413). In this way, it will be possible to process the specimen to the desired depth. For stopping processing, it is possible to switch ON the second blanker 132 to shield the ion beam. However, it is better to shield the same with the first blanker 128 to limit damages to the projection mask 115.

We will then describe how to cope with anomalies by means of a current monitor. It is possible to monitor with the configuration shown in FIG. 1 the current in the Faraday cup 130, in other words the ion beam current on the projection mask 115, and the current in the Faraday cup 134, in other words the ion beam current that has passed through the aperture of the projection mask 115. Here, the current in the first Faraday cup is represented by $I_{b1}$ and the current in the second Faraday cup 134 is represented by $I_{b2}$. When normal processing is possible, in other words when the ion-beam irradiating optical system is free of any failure, the respective current value $I_{b10}$ and $I_{b20}$ of the first and second Faraday cups is to be stored in advance in the memory of the central processing unit 112. Incidentally, although there are actually different $I_{b20}$ for a plurality of apertures of the projection mask, in order to simplify description, we will describe one of them. And we will set a normally usable current value. The upper limit and the lower limit of the current value of the normally usable first Faraday cup 130 are respectively represented by $I_{b1u}$ and $I_{b1l}$. For example, these upper and lower limits may be set by empirical rules, or by a certain percentage. An example of setting by percentage is, if the case of ±20% is a normal range, $I_{b1u}=1.2\ I_{b10}$, $I_{b1l}=0.8_{b10}$. In the case of the second Faraday cup 134, in the same way the upper limit and the lower limit of the normal range of use are respectively represented by $I_{b2U}$ and $I_{b2L}$.

As for the use of each ion beam monitor, as described above, the stability of ion beams when the specimen is not fabricated is monitored by $I_{b1}$, and for setting the fabricating parameters $I_{b2}$ is monitored. We will now describe below the actions taken to cope with various anomalies of the current monitor. Here, for these anomalies we presume the case where the monitor could be used normally before, and we do not presume any failure that occurs during a discontinuous use after a maintenance work and the like, for example one resulting from the replacement of a component part of ion-beam irradiating optical system 105. However, even in such a case, the following actions taken to cope with the situation will serve as a guide for positioning the failure.

(a) In the case of $I_{b1} > I_{b1U}$ or $I_{b1} < Ib_{1L}$

In other words, this is a case wherein a current failure has occurred above the projection mask 115. In this case, what seems to be the most probable cause of failure is a failure of the ion source 116. For example, in the case of the plasma ion source used in this embodiment, anomalous pressure of the feed gas, discharge trouble or disruption of the ion path due to contaminants, cause of discharge troubles by plasma spatter of the electrode and the like are possible. Of course, there are cases of possible anomalies in the power source including those other than the ion source 116. Accordingly, the following measures to cope with such anomalies are possible.

(a-1) Indication of Warnings

Figure 5A:
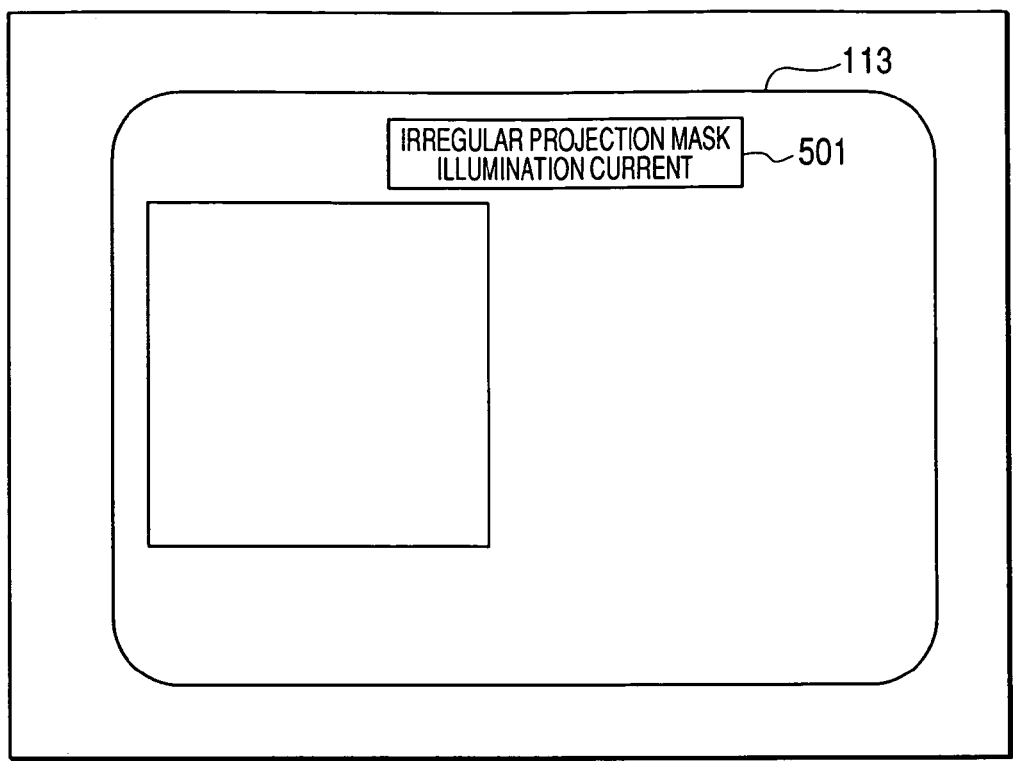
FIG. 5A and FIG. 5B show an example of failure display according to the First Embodiment.
Figure 5B:
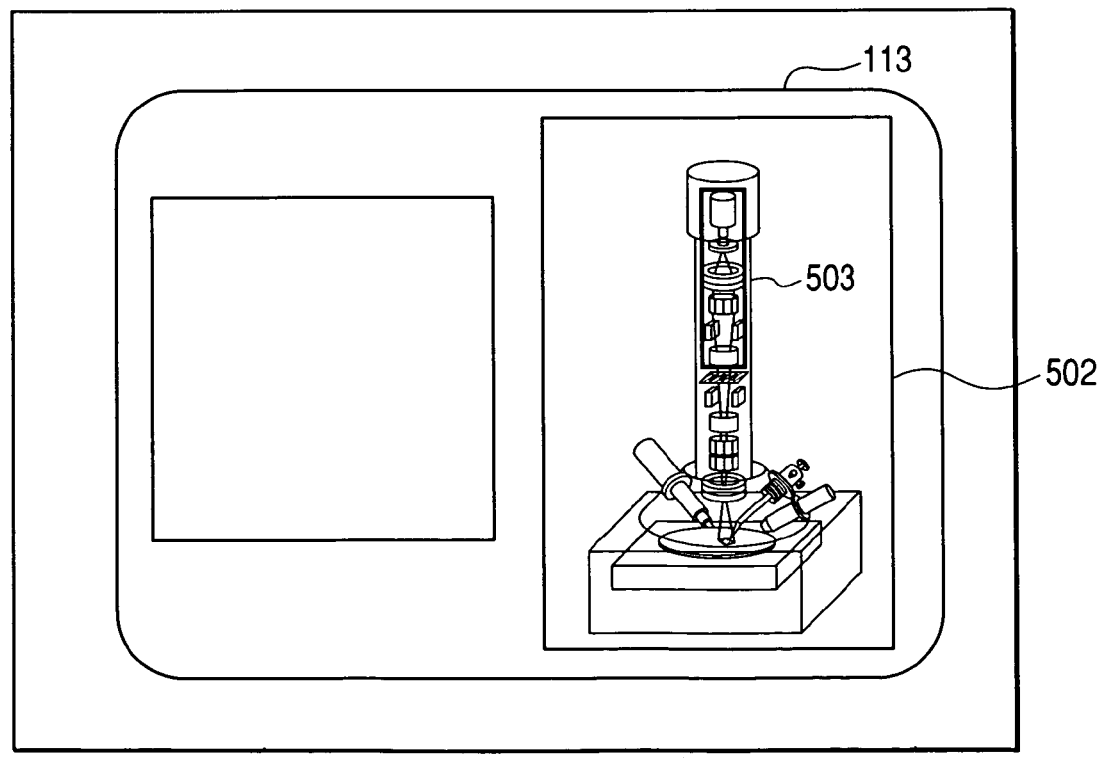

As shown in FIG. 5A, an indication 501 showing various anomalies such as "Failure of the irradiation current on the projection mask", "Failure of the current on the ion source side," or "Please contact with the Call Center to inform the failure" is made on the display 113. In connection with this display, it will be possible to prevent any processing failures if the processing start button is locked. Incidentally, the square frame in the display 113 represents an area for the display of images to be observed. And as shown in FIG. 5B, an indication of the structural schematic diagram 502 of the apparatus in the display 113 and an indication of the affected part of the same, for example in this example an area 503 on the ion source side of the projection mask may be accentuated by a blinking light or a highlight so that the failure may be easily recognized and that the user may be able to locate the position of the failure. And the failure and the failure information may be outputted as failure information in the form of sound information by means of a buzzer or a sound synthesizing technology to inform the user of the failure. And when the central processing unit 112 is connected with the Internet, the failure information may be provided to the manufacturer of the apparatus through the Internet to request a response from a service engineer. All these may be referred to as "the output unit" for outputting the failure information.

(a-2) Indication of the Corresponding Manual

Figure 6:
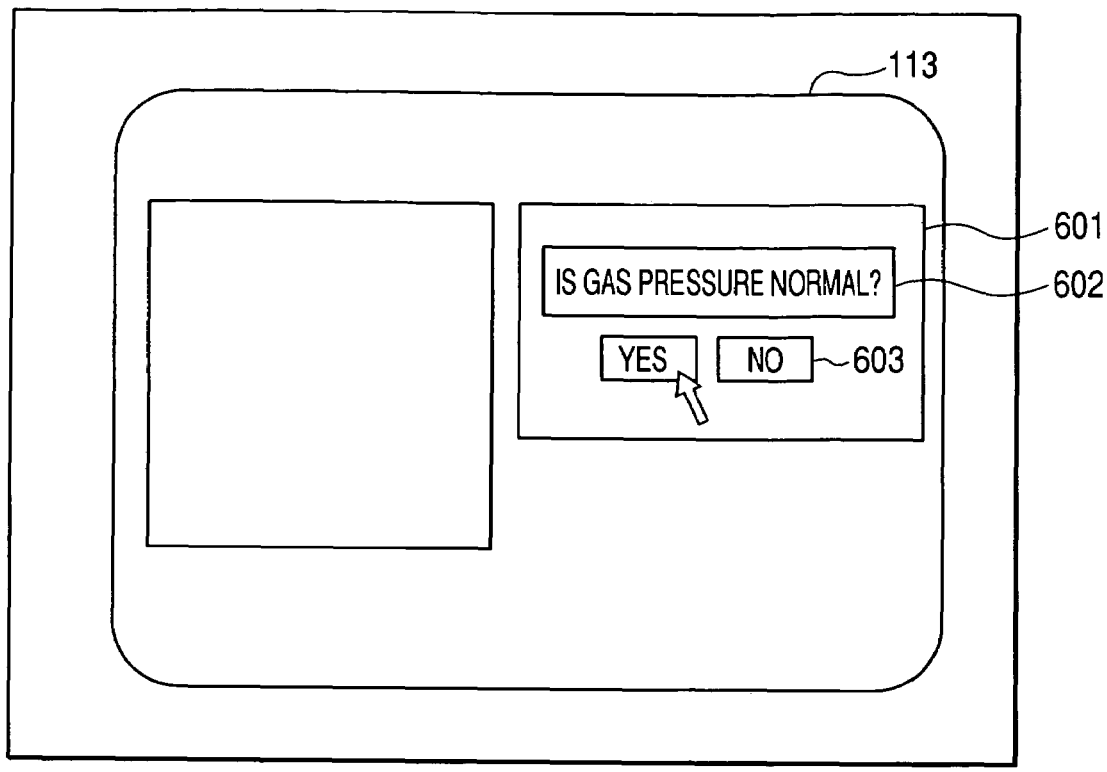
FIG. 6 is a drawing showing an example of displaying the corresponding manual according to the First Embodiment.

The recommended procedure 601 to be taken by the user to return to the normal state from the abnormal state as shown in FIG. 6 is displayed on the monitor 113. Since the parts highly liable to be the cause of the failure in the order of items displayed are involved, the choice of items that can be easily investigated will result in a higher efficiency. In the example of this embodiment, for example the following question 602 reading: "Is the gas pressure normal?" is displayed in the monitor. A pressure applied on either one of the buttons "Yes" or "No" 603 corresponding to this question leads to the subsequent option. If the choice is "No," the following instruction reading: "Adjust the gas pressure to the normal pressure range" is displayed. If the choice is "Yes," the process passes to the subsequent adjustment. Here, for example, an instruction reading: "Adjust the extractor so that the ion beam current may take the maximum value" is displayed. In the case of this embodiment, the extractor 118 is designed to have a mechanically adjustable mechanism from the atmosphere. Such adjustable items are displayed successively on the screen. When the adjustable items have been exhausted, maintenance procedure instructions involving opening to the atmosphere reading such as "Replace the ion source cathode" and the like are displayed.

(a-3) Automatic Compensation

Figure 7:
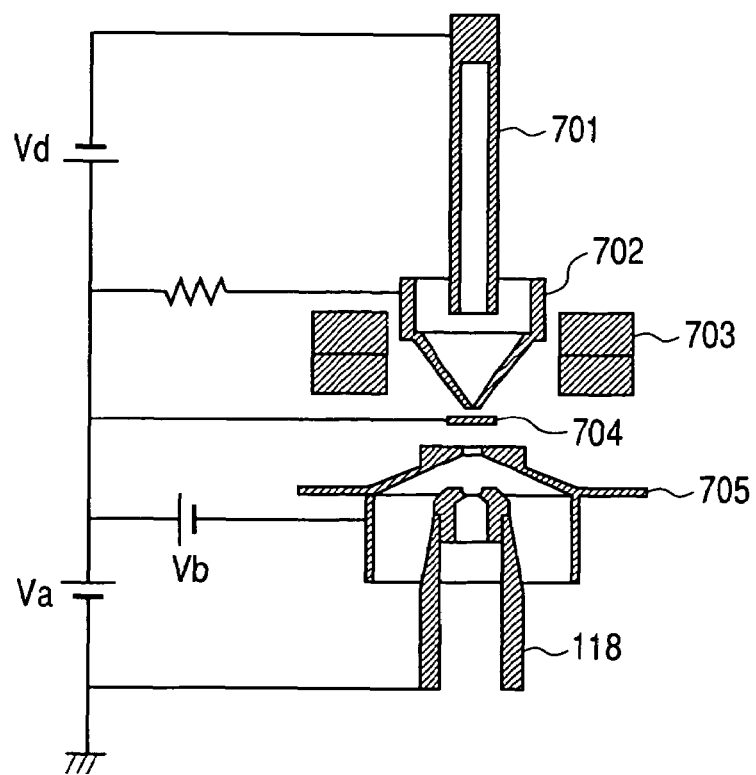
FIG. 7 is a drawing showing an example of the configuration of the duoplasmatron according to the First Embodiment.

To begin with, the question of whether all the optical parameters that can be monitored are completely within the normal range or not by means of the central processing unit 112. For example, these are the degree of vacuum of the ion-beam irradiating optical system 105, plasma discharge source voltage, ion acceleration voltage, illumination lens source voltage, etc. If these are out of the normal range, they are first of all compensated to the normal values, and the ion beam current $I_{b1}$ is monitored again. These processes are automatically carried out by the central processing unit 112. There is no problem if the ion beam current returns to the normal value. When they do not return to their normal value, other adjustable parameters are used to compensate them. For example, we will show below an example of compensation by the plasma ion source configuration used in this embodiment. FIG. 7 shows the configuration of a duoplasmatron used in this embodiment and includes a cathode 701, a middle electrode 702, a magnet 703, an anode 704, a control electrode 705 and an extractor 118. In this figure, Vd represents discharge voltage, Vb represents control voltage and Va represents acceleration voltage. Among these, the acceleration voltage Va, parameter for determining the energy of ion beams, is not generally used as a parameter for compensation. The discharge voltage Vd whose optimum value changes due to gas pressure and the like generally does not require any change in the discharge voltage if the gas pressure and the like is normal. On the contrary, the condition requiring a change in the discharge voltage indicates that the plasma itself is not in an adequate state, and therefore any compensation due to the discharge voltage is not so desirable. A parameter that can be compensated without changing the energy of ion and the state of plasma is control voltage Vb. Therefore, it is possible to compensate by fluctuating this control voltage Vb by the central processing unit 112 while monitoring the ion beam current $I_{b1}$ and setting the control voltage Vb so that the ion beam current may be within the normal range of $I_{biU} > I_{bi} > I_{biL}$. And it is sometimes possible to compensate by fluctuating a deflector 136 other than this control voltage Vb. If it is impossible to compensate by all these means, the measures described in the above subparagraphs (a-1), (a-2) and the like have to be taken to cope with the situation.

By taking the measures described above, it will be possible to control processing failures and to compensate when the ion beam above the projection mask is anomalous.

(b) In the case of $I_{biU} > I_{bi} > I_{biL}$ and $I_{b2} > I_{b2U}$

In other words, this is the case wherein the current value above the projection mask 115 is normal and the ion beam current passing through the projection mask 115 has increased. In this case, what is considered to be the most probable cause of failure is damages to the projection mask 115. In other words, we assume that the projection mask has been spattered by the ion beams and its aperture has grown large. Therefore, the following measures can be taken.

(b-1) Indication of Warning

As shown in FIG. 5A, an indication showing various anomalies such as "Failure of the projection mask", or "Please take a contact with the Call Center to inform the failure" is made like (a-1) on the monitor 113. And by locking the processing start button and taking similar operations simultaneously with these measures, it will be possible to prevent processing failures. And as shown in FIG. 5B in subparagraph (a-1), an indication of the rough configuration of the apparatus in the monitor 113 and an indication of the affected part of the same, for example in this example the projection mask may be displayed by a blinking light or a highlight so that the failure may be easily recognized. And the failure and the failure information may be outputted as failure information in the form of sound information by means of a sound synthesizing technology to inform the user of the failure. And when the central processing unit 112 is connected with the Internet, the failure information may be provided to the manufacturer of the apparatus through the Internet to request a response from a service engineer as stated above.

(b-2) Indication of the Corresponding Manual

Indication on the monitor 113 the corresponding flowchart of steps to be taken by the user to return to the normal state from the failure as shown in FIG. 6 in subparagraph (a-2). In the case of this embodiment, the method of replacing the projection mask is shown on the screen. For example, the method of switching OFF the elements of the ion-beam irradiating optical system, stopping the vacuum exhaust system of the ion-beam irradiating optical system, opening the ion-beam irradiating optical system to the atmosphere, replacing the projection mask 115 and so on.

(b-3) Automatic Compensation

In order to judge whether the damage to the projection mask 115 is a valid reason or not as described above, the position of the projection mask is switched to another aperture (here referred to as the aperture B) different from the aperture in which the failure was found (here referred to as the aperture A), and monitor to verify that the current passing through the aperture B (the current in the second Faraday cup 134) is within the normal range of the aperture B or not. This takes advantage of a low possibility that the apertures grow wider all at once due to the damages incurred because of differences in the frequency of use for each aperture. In other words, if the current passing through the aperture A is anomalous while the current passing through the aperture B is normal, it can be confirmed that only the aperture A has been damaged. If a projection mask 115 having a plurality of apertures of the same shape as the aperture A (for example one having apertures A') is used, it is possible to prohibit the use of the aperture A by controlling the projection mask driver 126 through the projection mask controller 125 by the command of the central processing unit 112 and by automatically switching so that an alternative aperture A' may be used.

The measures described above, if taken; will enable to limit processing failures resulting from damages to the projection mask.

(c) In the Case of $I_{biU} > I_{bi} > I_{biL}$ and $I_{b2} > I_{b2U}$

Figure 8:
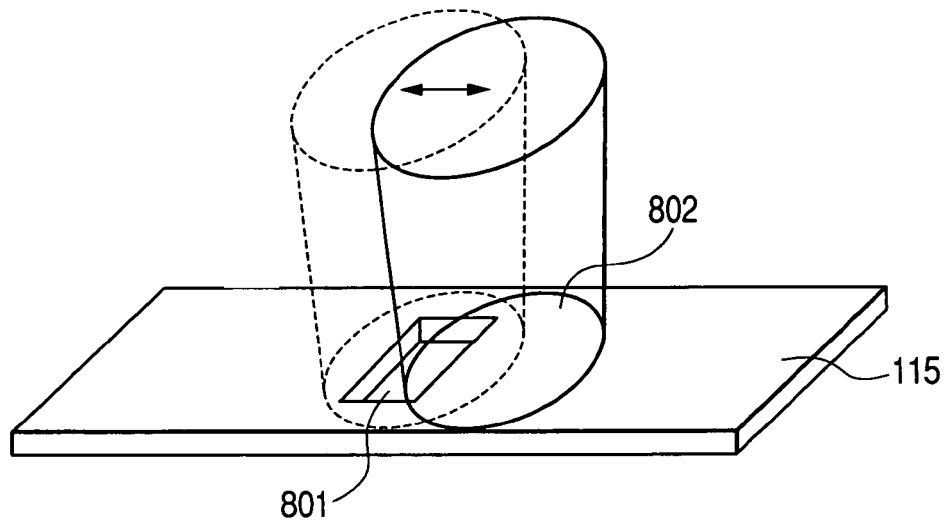
FIG. 8 is a drawing for describing a misalignment of ion beam irradiation towards the projection mask according to the First Embodiment.

In other words, this is the case wherein the current value above the projection mask 115 is normal and the ion beam current passing through the projection mask 115 has decreased. In this case, what is considered to be the most probable cause of failure is a deviation of the illumination beam 802 to the aperture 801 of the projection mask as shown in FIG. 8. In other words, it is possible that the aperture is not properly irradiated with ion beams although the absolute value of the irradiation current vis-à-vis the projection mask 115 has not changed. Therefore, the following measures are possible.

(c-1) Indication of Warning

As shown in FIG. 5A, an indication showing various anomalies such as "Failure of the projection mask" is made in the monitor in the same way as in subparagraphs (a-1) and (b-1) (b-1). And by Locking Processing Starting Button simultaneously with these measures, it will be possible to prevent processing failures. And as shown in FIG. 5B in the same way as in subparagraph (a-1), the rough configuration of the apparatus in the monitor 113 and the affected part of the same, for example in this example the deviation of the beam towards the projection mask may be displayed by a blinking light or a highlight so that the failure may be easily recognized.

(c-2) Indication of the Corresponding Manual

The corresponding flowchart of steps to be taken by the user to return to the normal state from the failure as shown in FIG. 6 in subparagraph (a-2) (b-2) is displayed on the monitor 113. In the case of this embodiment, these steps include the adjustment of the deflector 136, the positioning of the extractor 118 and the like.

(c-3) Automatic Compensation 1

Figure 9:
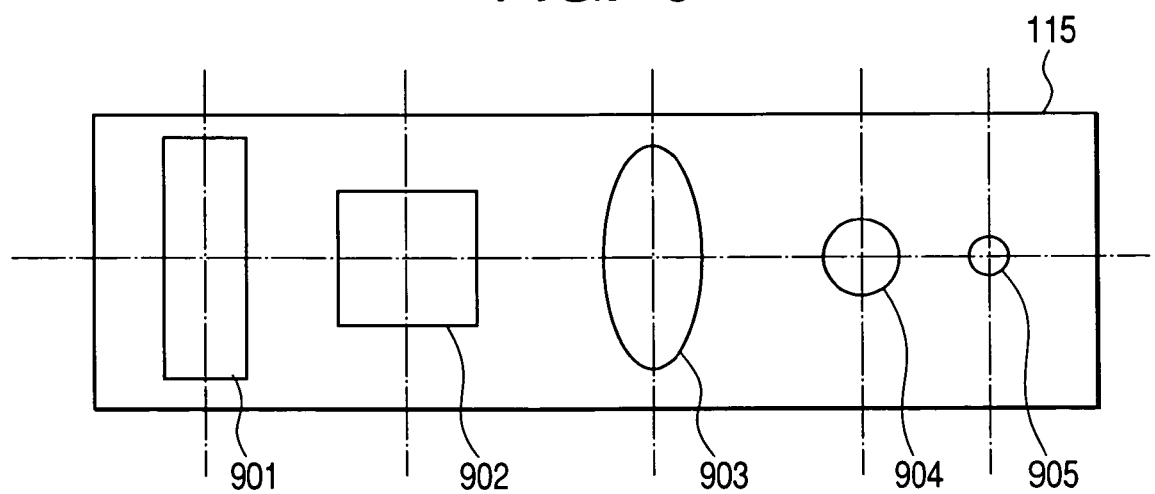
FIG. 9 is a drawing showing examples of center symmetrical apertures according to the First Embodiment.
Figure 10A:
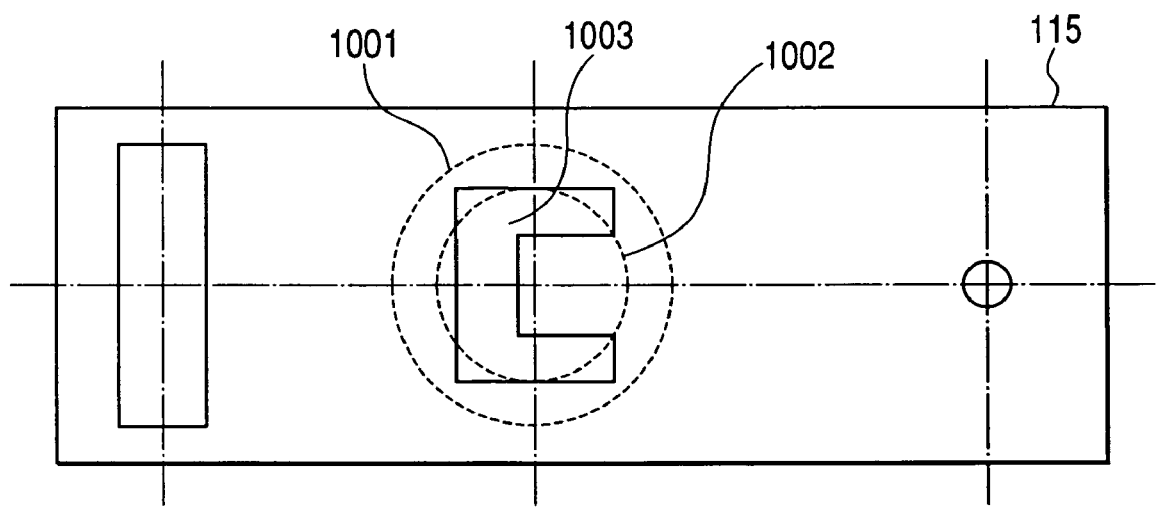
FIG. 10A and FIG. 10B show an example of ion beam irradiation at a not center symmetrical aperture according to the First Embodiment.
Figure 10B:
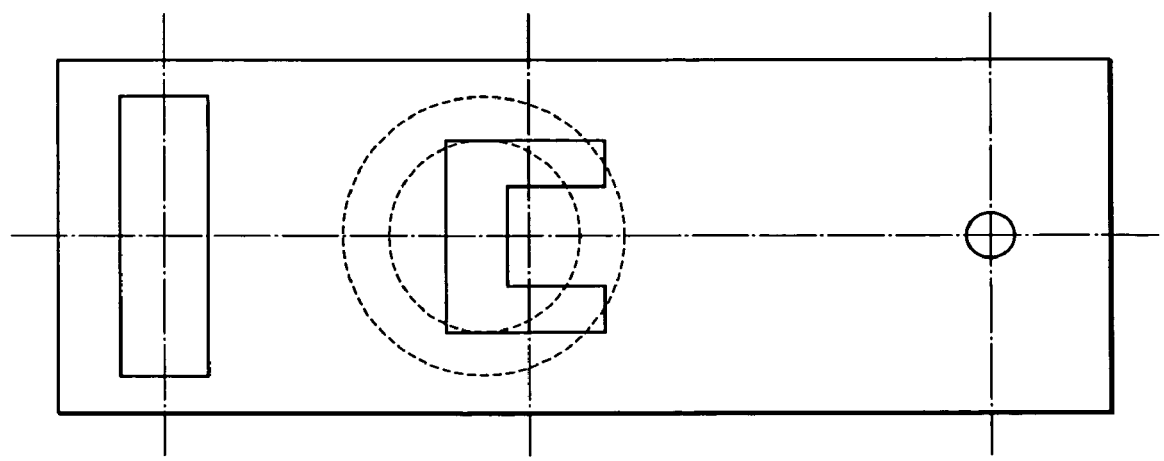

A system configuration that can be adjusted from the central processing unit 112 among those in which the irradiation position of ion beams towards the projection mask 115 is adjustable is the deflector 136. Accordingly, it is sometimes possible to compensate automatically by setting the voltage of the deflector 136 at a position where the ion beam current value $I_{b2}$ may be the maximum while monitoring the same by the central processing unit 112. As for the aperture for use in such a case, a simple center symmetrical aperture is desirable: for example, circular, square or rectangular apertures 901 to 905 as shown in FIG. 9. This is because, if the profile of the illumination ion beam 1001 is dense in the center area 1002 and sparse in the periphery as shown in FIGS. 10A and 10B, for example in the case of U-shaped aperture 1003, the passing ion beam current shown in FIG. 10B grows larger than that shown in FIG. 10A being irradiated in the normal center of the aperture 1003. As a prerequisite condition for this, the center of each aperture at the time of choice by the driver 126 of the projection mask 115 must be aligned. By adjusting the deflector 136 by using simple center symmetrical apertures in this way, and compensating the position of illumination ion beams, it is possible to compensate any deviation in irradiation position.

(c-4) Automatic Compensation 2

Figure 11A:
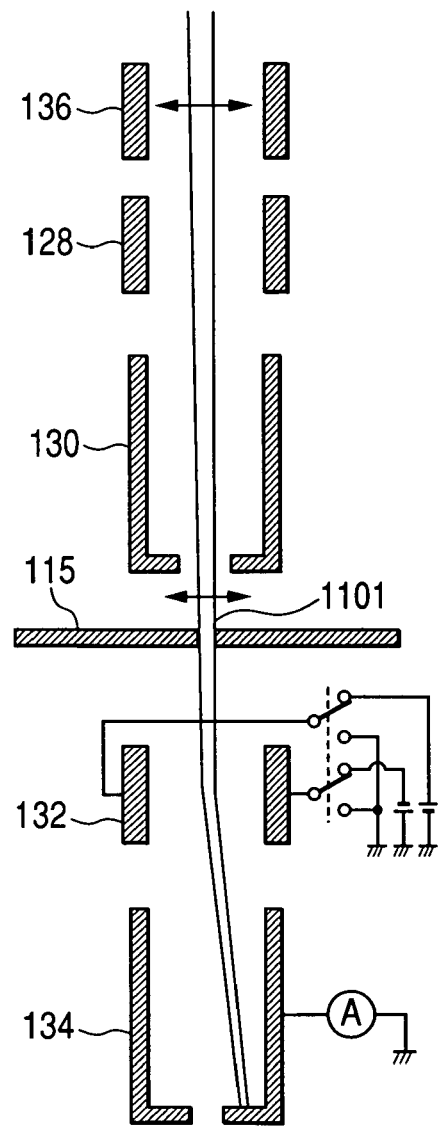
FIG. 11A, FIG. 11B, and FIG. 11C show an example of how to acquire the ion beam profile according to the First Embodiment.
Figure 11B:
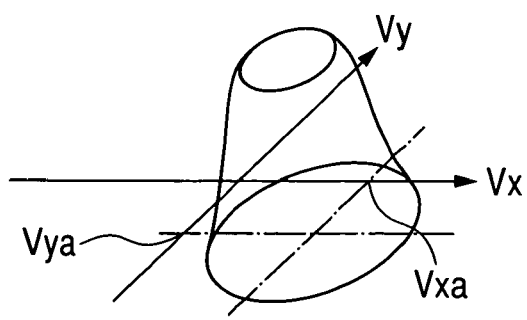
Figure 11C:
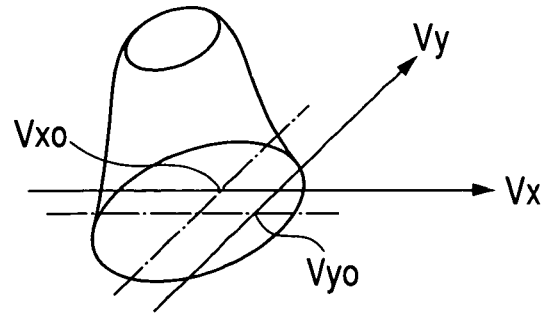

The maximization of the absolute value of the passing ion beam current $I_{b2}$ by the ion beam deflection as described in subparagraph (c-3) is a simple and effective means of adjustment. A further detailed adjustment method is to acquire the beam profile of the ion beam being irradiated on the projection mask and to compensate the same. We will describe this method with reference to FIGS. 1A to 1C. First, a pinhole aperture 1101 is chosen. For this pinhole aperture 1101, it is preferable to choose the minute possible aperture on the premise that the passing ion beam current $I_{b2}$ can be monitored, because this diameter of hole determines the resolution of the beam profile. Here, a minute circular aperture S is chosen, and at this time the passing ion beam to be monitored by the second Faraday cup 134 is represented by $I_{b2S}$. Here, a deflection scanning signal is applied by the deflector 136, and the ion beams with which the projection mask 115 will be irradiated are used for deflection scanning. From this deflection scanning signal and the $I_{b2S}$ value of the ion beam current resulting from its application both serving as intensity signals, a profile such as the one shown in FIG. 11B can be obtained. Incidentally, it is preferable to acquire in advance the beam profile in the normal state as the one shown in FIG. 11C and store the same in the central processing unit 112, because it will be possible to compare the same with anomalous states. FIGS. 11B and 11C show examples wherein the voltage point zero (not deflected state) of the deflector 136 is taken as the original point. Incidentally, during use (before the outbreak of a failure) a voltage is often applied to the deflector 136 for adjusting the ion beam axis. This voltage is represented by $(Vx_0, Vy_0)$ on the assumption of 2-axis deflection for example for the sake of simplification. And the beam profile at the time of failure is evaluated and compensated by the central processing unit 112. A compensation is carried out by, for example, judging the amount of deviation of the barycentric position of current strength. If the barycentric position of current strength at the time of failure is (Vxa, Vya), the application of (Vxa, Vya) on the deflector 136 (in other words a shift of $(Vxa-Vx_o, Vya-Vy_o)$) enables to adjust the ion beam to the optimum irradiation position. In the case of a more detailed evaluation, it is possible to evaluate by comparing, for example, the peak current value in the profile at the time of normal operation and the peak current value at the time of a failure or by comparing the forms of the beam profile, in other words the form and area of the sphere with a specific current flow or more, for example the sphere accounting for 13.5% or more of the peak current during normal operation and the same at the time of failure. In other words, if the illumination beam has only jolted out of alignment, these peak values and profile form should not change much. However, if these values have changed substantially, it is possible to judge that a compensation by a beam shift is not enough to cope with the situation. If it is judged that a compensation by the method described here is not enough to cope with the situation, the measures described in subparagraphs (c-1), (c-2) and the like must be taken.

Figure 12:
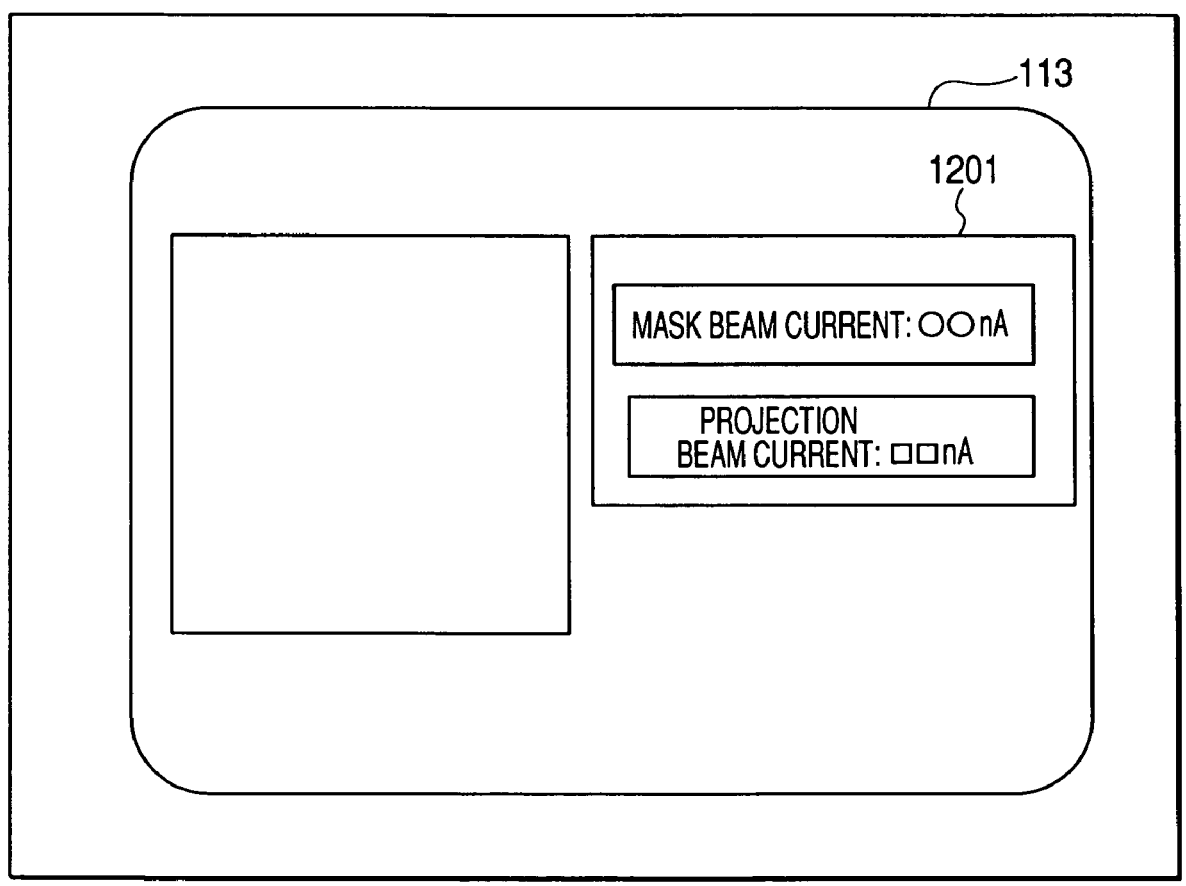
FIG. 12 is a drawing showing an example of displaying the ion beam monitor values at two points according to the First Embodiment.

As described above, according to the configuration of this embodiment, it is possible to sort out the cause of failure by monitoring the current of two Faraday cups, to compensate the failure and accordingly to use stably the device. And the indication of two current values in the indication window 1201 of the screen as shown in FIG. 12 so that the users may be able to monitor the same is useful for them to sort out the cause.

Figure 13A:
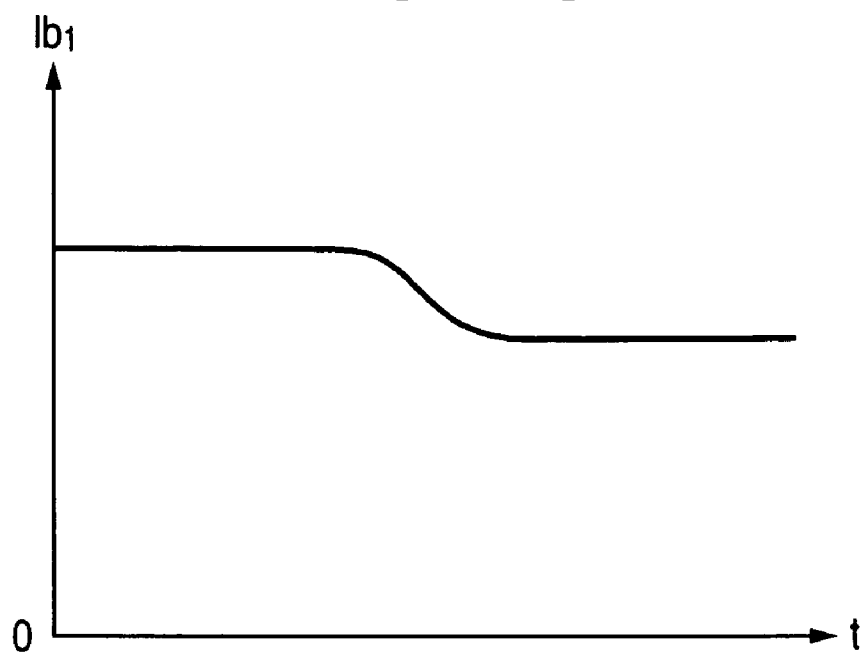
FIG. 13A and FIG. 13B show an example of changes in time and the monitored ion beam current according to the First Embodiment.
Figure 13B:
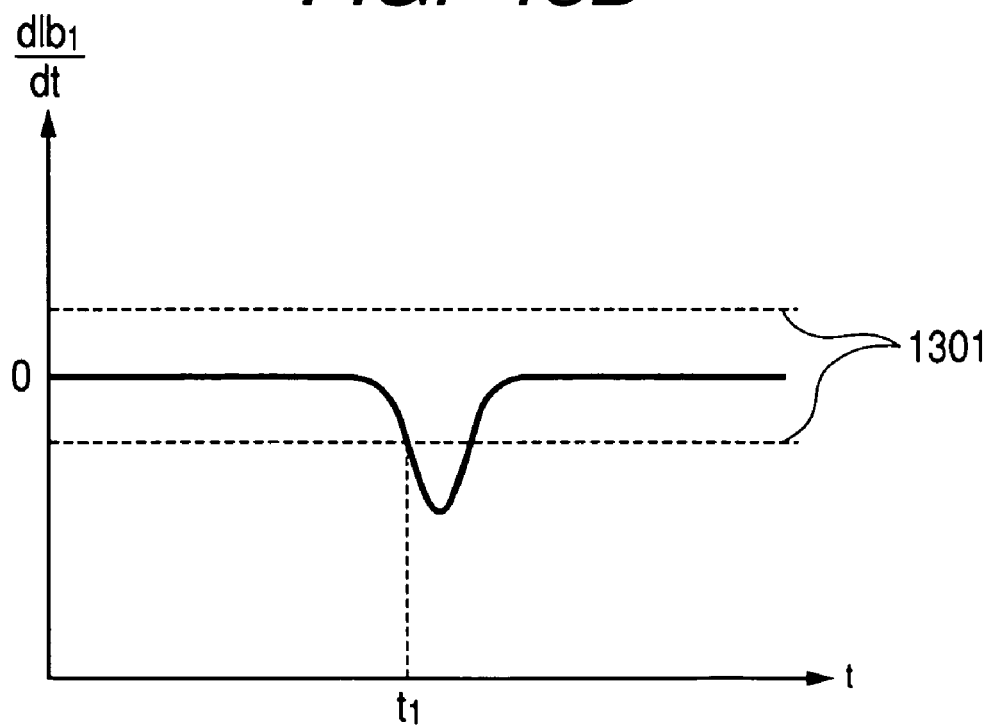

So far, we have described the case wherein the normal state and failure are broken down and identified based on the predetermined limits of normal operation. But we may otherwise break down and identify the cause of failure on the basis of change ratio. In particular, since it is possible to monitor constantly the first Faraday cup current $I_{b1}$ except during processing, it is possible to judge a failure considering that a sudden change in state $t_1$ has occurred when the absolute value of change ratio has exceeded a certain threshold 1301 as shown in FIG. 13B with reference to changes with the passage of time $I_{b1}$ stored as shown in FIG. 13A.

And as a variant to this embodiment, we will show in FIG. 14 an example of a composite device constituted by a Scanning Electron Microscopy (hereinafter referred to as SEM) to which the principle of the apparatus for ion beam fabrication has been applied as shown in FIG. 1 and an apparatus for ion beam fabrication. This composite device includes an ion-beam irradiating optical system 105 and an electron beam irradiating optical system 1401 provided in a vacuum chamber 114 and can detect and observe defective parts of the specimen 101 by its SEM function. The electron beam irradiating optical system 1401 is controlled by a controller 1406 for an electron beam irradiating optical system. The reason why electron beam 1402 is used for inspection is that electron beam, unlike ion beam, does not damage the specimen wafer for inspection and that it has generally a higher resolution than ion beam on the current devices.

At the observation positions within the specimen among the defective parts thus detected, sectional processing is carried out by means of the ion-beam irradiating optical system 105, or specimens for analysis are processed by means of a microsampling method or other microspecimen extraction methods. Here, the figure shows an example including a slanting ion-beam irradiating optical system 105 so that specimens may be extracted even on a non-tilting specimen stage.

Figure 14:
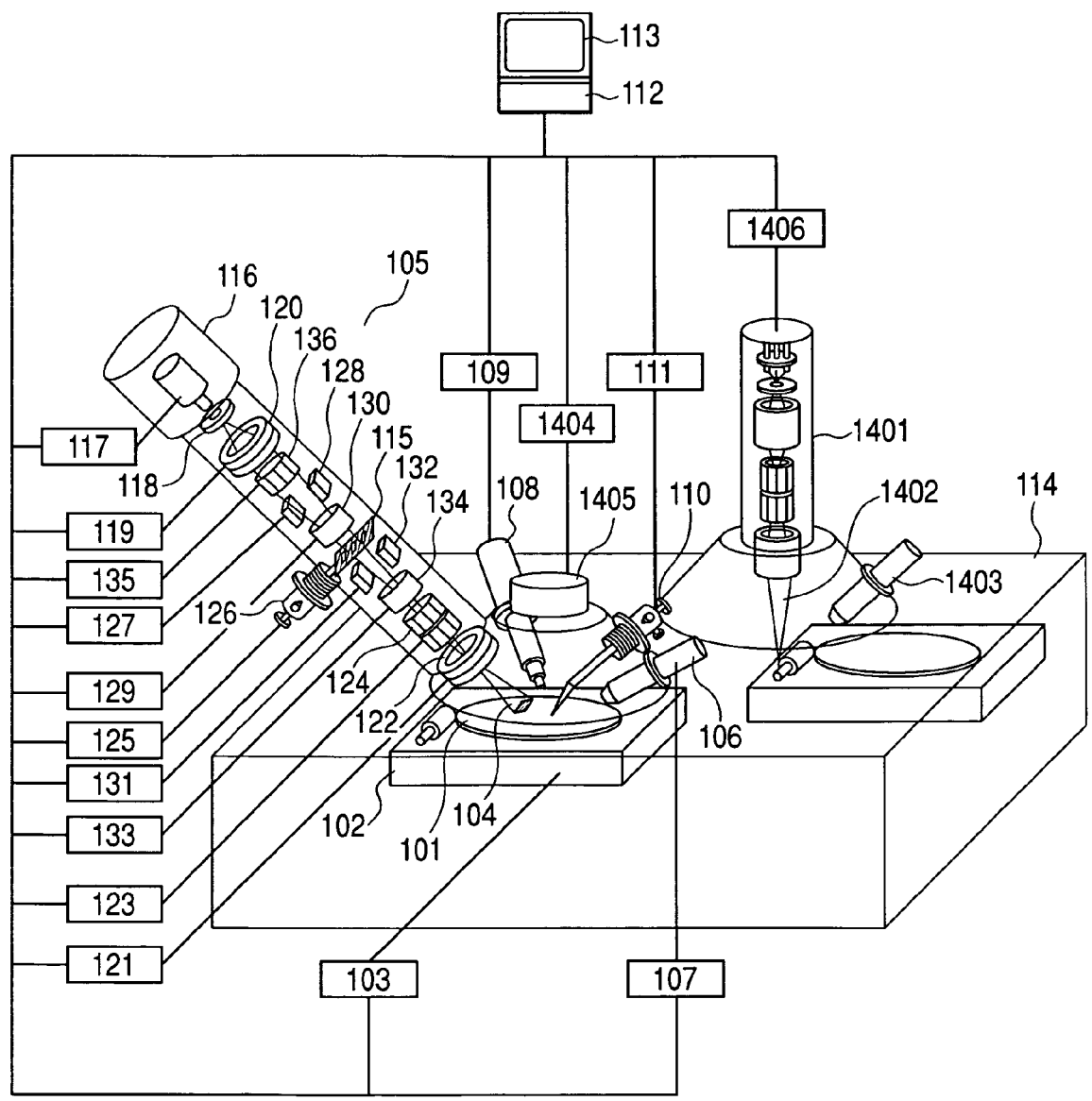
FIG. 14 is a drawing showing an example of configuration of a composite PJIB—SEM device as a variant of the First Embodiment.

In the example of configuration shown in FIG. 14, the whole system is configured by an electron beam irradiating optical system 1401 and an ion-beam irradiating optical system 105 irradiating beams at different positions. In other words, in order to irradiate beams at the same position within the specimen, it is necessary to move the specimen stage 102. However, since this configuration eliminates the mechanical interference between the electron beam irradiating optical system 1401 and the ion-beam irradiating optical system 105, it is possible to reduce the distance between the optical outlet and the specimen. And this has the advantage of facilitating the effort to realize a high resolution and a large current. On the other hand, although not shown in the figure, it is also possible to adopt a configuration wherein the electron beam and the ion beam may be irradiated to converge at a same point. In this case, it is necessary to make the optical tip slim in order to avoid mechanical interference between the optical systems. However, this has an advantage of allowing to observe the part processed by ion beams by means of electron beams on the spot.

The codes 101-136 in FIG. 14 are identical to the codes of the same number in FIG. 1, and we omit explanations on them here. An assisting gas supplying source 1403 supplies assist gas used for electron beam assist position or electron beam assist etching. A height sensor 1405 for measuring the height of the specimen 101 is controlled by a height sensor controller 1404.

The position coordinate of defective parts thus detected by using electron beams 1402 is transmitted from the stage position controller 103 to the central processing unit 112 to be stored in memory there. However, since the precision required for the position subject to failure analysis is less than a submicron in devices whose miniaturization has been progressing in recent year, it is difficult to specify the position to be processed only by the absolute precision of the stage. Therefore, for example assist deposition gas is supplied from the assisting gas supplying source 1403, electron beam 1402 is irradiated near the defective part to mark with an electron beam assist deposition film and thus form a mark specifying precisely the defective part position. And a SEM image containing the defective part and the mark is acquired and is transmitted to the central processing unit 112 to be stored. In this way, the detected defective part can be processed and analyzed with ion beam. In other words, the specimen stage 102 is moved by the control of a stage position controller 103 to the position coordinate of the defective part stored in the central processing unit 112 so that the detected defective part may come within the irradiation position of the ion beam 104. Although depending on the precision of the stage position, generally as a result of this displacement of stage, the defective part, in other words the mark by the above-mentioned electron beam assist deposition enters the ion beam scanning area. By acquiring the SIM image and comparing the same with the SEM image recorded in the central processing unit 112 in advance, it will be possible to specify the defective part to be process from the mark position and to analyze the defect. In this way, the process starting with the detection of defect and ending with the analysis of defect can be easily realized.

Since the device shown in FIG. 14 can analyze on the spot the detected defective part consistently within the same device, it will be possible to analyze the defect in a short period of time. In addition, by using ion that does not contaminate the specimen for the ion beam to be used for processing, for example oxygen, nitrogen, argon and the like, it will be possible to inspect and analyze the specimen wafer without causing contamination, and return the analyzed wafer to the production process line. In the case of this device, since the inspection time by means of electron beam 1402 often account for more than half of the operation time of the device, the ion-beam irradiating optical system 105 is often is in the standby state. However, since the switching OFF of the ion source in the standby state harms the stability of ion beams at the time of restart, it is desirable to keep the ion source working always. Therefore, as described above, during this standby period it is very effective to keep the first blanker 128 ON so that the projection mask 115 may not be damaged and to monitor the stability of the ion beam current by the first Faraday cup 130.

While the above is an example of applying ion beam, it is also possible to apply electron beams for the adjustment of beams directed towards the mask used in an electron beams drawing device and the like.

By applying the apparatus for ion beam fabrication described in this embodiment, it is possible to detect any failure in ion beam, to sort out the cause and to compensate the failure. Therefore, it is possible to control failures of processing and to realize stable processing.

Embodiment 2

In this embodiment, we will describe an apparatus for ion beam fabrication for realizing detailed control of the service life of the projection mask by the present invention.

As described in First Embodiment, the projection mask 115 is a part having a short service life among the constituent parts in the device. Accordingly, while the replacement of any mask on which a failure of ion beam current has been found as shown in FIG. 1 is a way to deal with the situation, the estimation of its service life followed by its replacement in good time is effective for preventing any processing failures and for assuring a stable operation. However, leaving too much margin leads to a problem in that its service life is reduced. For this reason, it is important to estimate as precisely as possible its service life. In First Embodiment we described the relationship between the illumination ion beam $I_{b2}$ and the specimen processing by means of Formula 4. The same principle applies to the projection mask 115. In other words, Formula 5 stands valid as a mathematical formula of the service life tm of a projection mask.

$$t_m = K \cdot \frac{e}{u} \cdot \frac{d_m}{W_m \cdot S_m} \cdot (A_m \cdot D_m) \cdot \frac{1}{I_{b1}} \quad \text{(Formula 5)}$$

wherein dm stands for the density of the projection mask, Wm stands for the atomic weight of the constituent element of projection mask, and Dm stands for the thickness of the projection mask (thickness of the aperture). Sm stands for the spattering ratio of the projection mask, which is determined by the ion specie, energy of the irradiation ion towards the projection mask, and the constituent material of the projection mask. Am stands for the irradiation area of ion beams towards the projection mask, which can be calculated from for example the ion beam profile and the like described in FIG. 1 with reference to FIGS. 11A to 11C. K is a compensation coefficient, which is used particularly for compensating the effect of the spatter acceleration due to the edge effect of the aperture and has generally a value smaller than 1. For example, the value often is as small as 0.5.

Figure 15A:
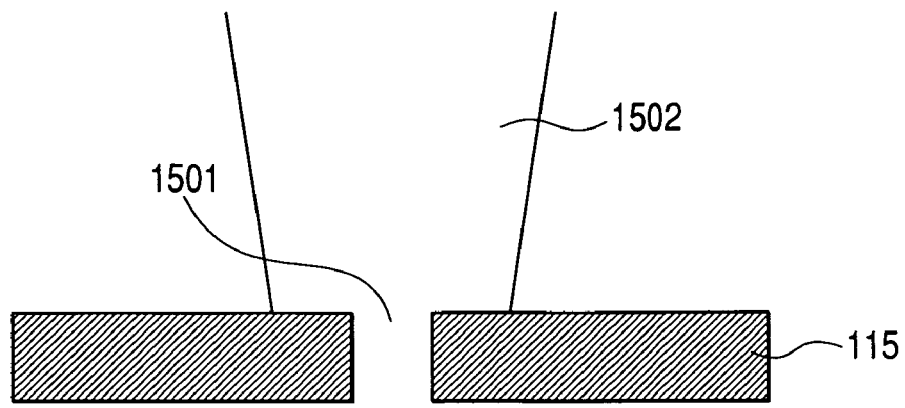
FIG. 15A, FIG. 15B, and FIG. 15C show spattering damages to the edge of the projection mask aperture for describing the Second Embodiment.
Figure 15B:
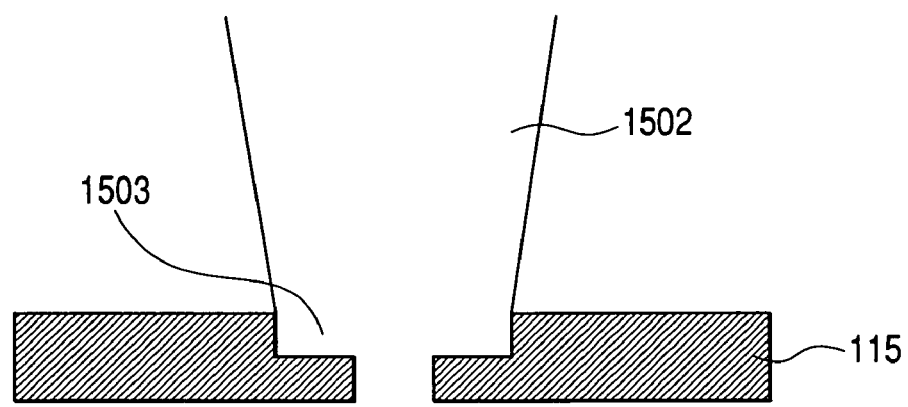
Figure 15C:
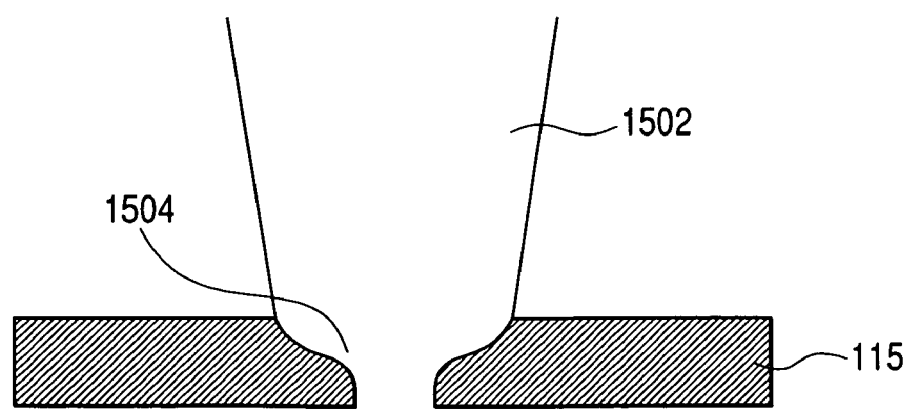

We will explain below on the edge effect of aperture with reference to FIGS. 15A to 15C. The initial state of the edge of the aperture 1501 is the section shown in FIG. 15A, and if the edge effect is nil, it would be processed like the damaged region 1503 shown in FIG. 15B by the irradiation of the ion beam 1502. In fact, however, the amount spattered of the edge region 1504 is greater as shown in FIG. 15C. This is caused by the fact that the spattering ratio is greater when the incident angle of the ion beam is slanted than in the case wherein it is vertical, and the processing of the aperture edge that was slanted once is accelerated. This acceleration effect can be compensated by the above-mentioned compensation coefficient K. Once the above values are set, then the service life time can be determined by the first Faraday cup current $I_{b1}$. However, this time tm calculated by the central processing unit is the service life of an aperture. The actual service life ta of an aperture is the irradiation time of ion beam during which the first blanker 128 is turned OFF after the selection of the aperture by the projection mask driving unit 126 among the operating time of the ion-beam irradiating optical system 105, and this is managed by the central processing unit 112. In other words, the projection mask can be used during the time by which this service time ta is shorter than the time tm. In reality, a margin is set, and when a 20% margin is set for example, when 0.8 times of the service time tm have passed, it is possible to inform the users that the time for replacement of the projection mask 115 has come by an announcement to this effect shown on a monitor 113 given by the central processing unit 112. Generally, the time when any one of the apertures has met the service life conditions mentioned above is taken as the end of service life. However, as described in First Embodiment, if the projection mask 115 has a plurality of projection masks of the same form, the aperture having met the service life conditions is forbidden to be used and the use of an alternative aperture can ensure the continuity of use.

Figure 16:
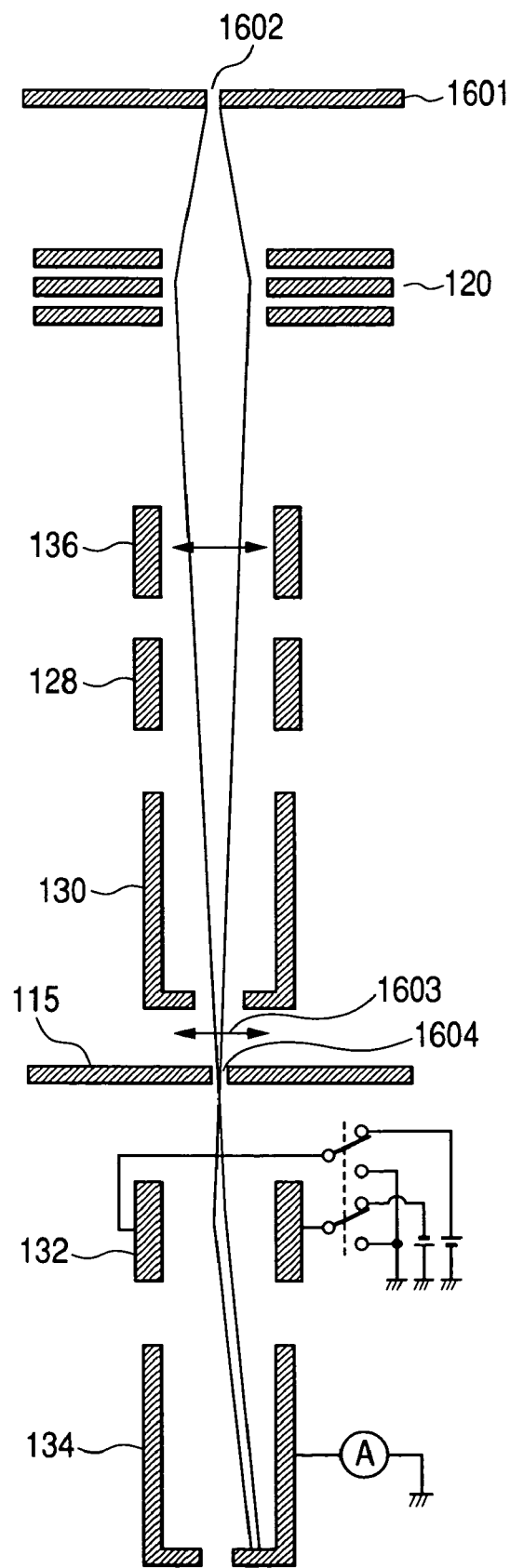
FIG. 16 is a drawing showing an example of configuration of the projection mask form monitor according to the Second Embodiment.

The introduction of the above-mentioned service life conditions calculated on the basis of the illumination beam current value to the projection mask is very effective for estimating easily service life. On the other hand, we will describe below the more detailed method of monitoring the aperture condition of the projection masks. As shown in FIG. 16, this ion-beam irradiating optical system includes an ion source limiting mask 1601 on the ion source side of the projection lens 115. Although not shown here, it also includes a large aperture for allowing the passage of large current ion beams for the processing of specimens and for miocrofabrication and a minute aperture for controlling the geometric aberration of the ion beam, and select apertures by the driver (not shown) of the ion source limiting mask. Here, it selects a pinhole aperture 1602 for monitoring the aperture form of the projection mask 115. Let us suppose that for example a 10 µm diameter aperture has been selected. Then, the voltage of the illumination lens 120 is set at a condition at which the aperture of this ion source limiting mask 1601 may be projected to the projection mask 115. At this time, if the projection magnification of the illumination lens 120 is Mc, ion beams will be irradiated on the projection mask 115 with a beam diameter of a magnitude resulting from the multiplication of 10 µm by Mc. Here, this ion beam 1603 is scanned by the deflector 136. for deflection scanning.

Figure 17A:
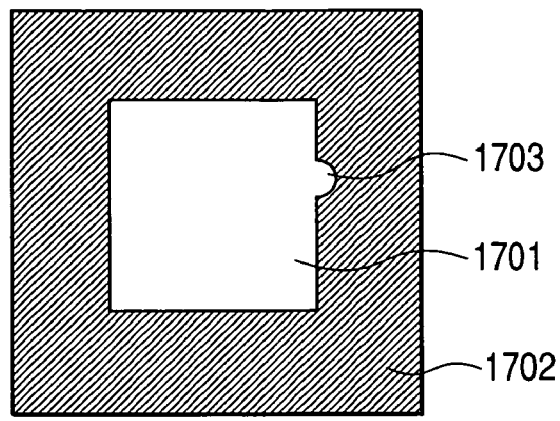
FIG. 17A, FIG. 17B, and FIG. 17C show an example of the profile of current passing through the projection mask aperture according to the Second Embodiment.
Figure 17B:
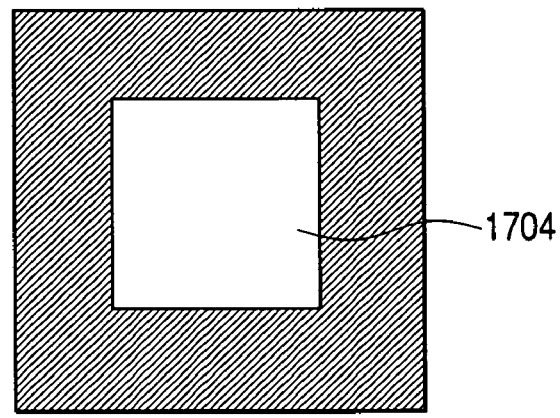
Figure 17C:
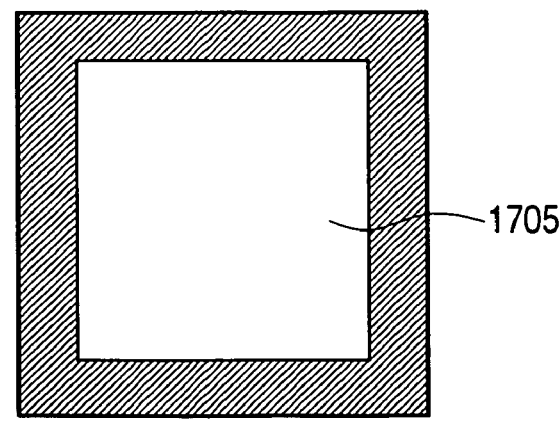

At this time, the passing current profile through the aperture can be obtained as shown in FIG. 17A by taking the second Faraday cup 134 current $I_{b2}$ as an intensity signal. In other words, this will be an image binarized by the edge of the aperture 1604, and the area 1701 where ion beams pass at the aperture is observed brightly and the area 1702 where, shielded by the projection mask, ion beams do not pass is observed dark. Here, damages at the edge of the aperture 1604 can be confirmed by comparing this image with the passing current profile of the aperture at the initial state of the projection mask recorded previously in the central processing unit 112 FIG. 17B. For example, FIG. 17A shows the region of deformed aperture pattern due to a irregular shape 1703 resulting from damages, and we can see that the projection mask has run out of its service life. And even when the region 1705 is found larger than the normal region 1704 as shown in FIG. 17C, it is a case wherein the dimension of the aperture has generally widened because of damages and we can conclude that it has run out of its service life.

Figure 18:
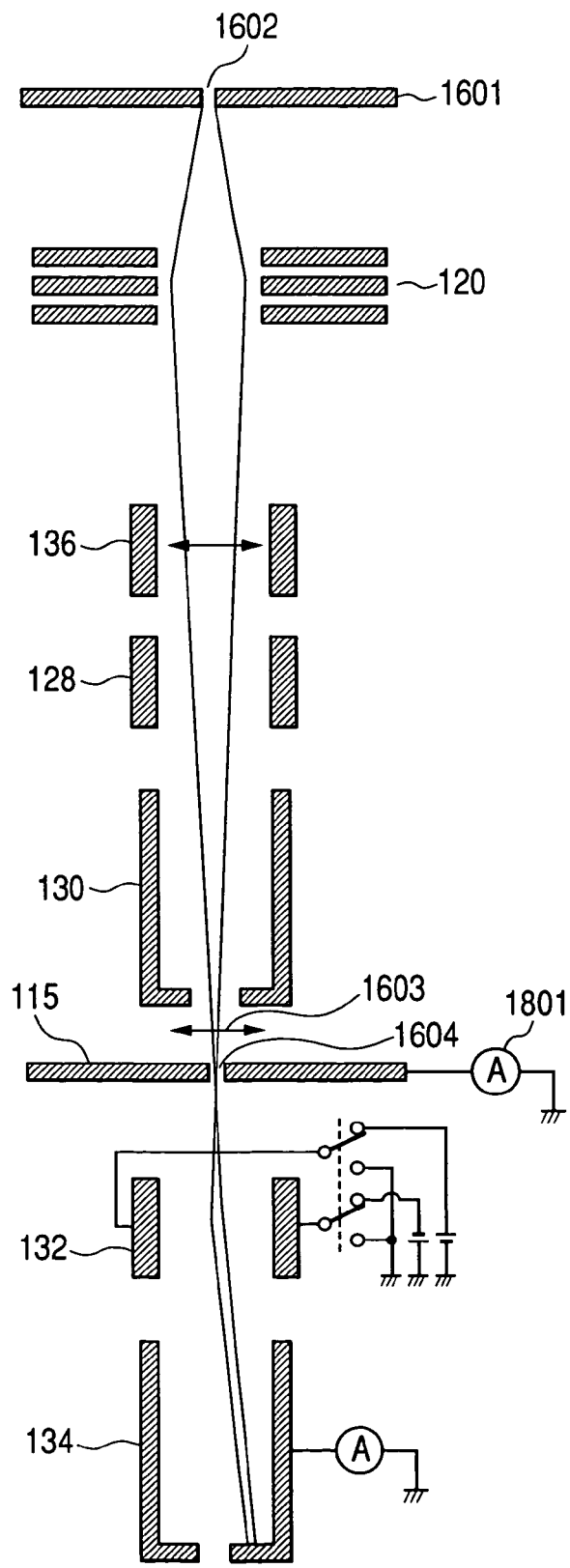
FIG. 18 is a drawing showing an example of the configuration of the second electron monitor having the shape of the projection mask according to the Second Embodiment.

The aperture monitor described with reference to the above-mentioned FIG. 16 is a method that enables to monitor the aperture edge. However, in order to obtain more detailed information of the aperture of the projection mask 115, it is preferable to adopt the configuration shown in FIG. 18. An important difference from FIG. 18 is that the projection mask 115 is connected with an ammeter 1801 and can measure the inflow current. Here, the projection mask inflow current Im is expressed by the following Formula 6.

$$I_m = I_{b1} - I_{b2} + I_e \quad \text{(Formula 6)}$$

where Ie represents the secondary electron current discharged from the projection mask by the irradiation of ion beams. In other words, from Formula 6 the secondary electron current Ie is expressed by Formula 7.

$$I_e = I_m + I_{b2} - I_{61} \quad \text{(Formula 7)}$$

Figure 19:
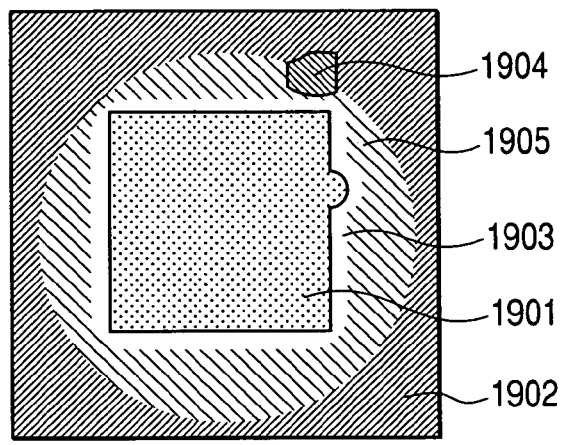
FIG. 19 is a drawing showing an example of the secondary electron image of the projection mask according to the Second Embodiment.

For this reason, as described in FIG. 16, it is possible to obtain the secondary electron image of the projection mask 115 as shown in FIG. 19 by, on the condition that the pinhole aperture 1602 of the ion beam limiting mask 1601 would be projected on the projection mask 115, having the central processing unit 112 carry out the calculation of (Formula 7) by deflecting the ion beam 1603 by the deflector 136 for deflection scanning and by monitoring the first Faraday cup current $I_{bi}$ measured in advance, the second Faraday cup current $I_{b2}$ resulting from the deflection scanning and the projection mask inflow current $I_m$. Since this image transforms the ease of discharging secondary electrons into image, the aperture part is observed as dark as the area 1901 and the other areas 1902 and the like are observed bright. And for example the area 1903 wherein the aperture edge is chamfered obliquely is observed brightly while the area 1904 tainted with contaminants and the like is observed dark. Thus, unlike FIGS. 17A to 17C, more detailed information on the periphery of the aperture can be obtained. And the observation of the damaged region 1905 leads us to finding how the aperture is irradiated with the ion beam and how the irradiation positions have shifted.

Since it is possible to grasp more detailed condition of damages to the projection mask by using the apparatus for ion beam fabrication having the ion-beam irradiating optical system described in this embodiment, it is possible to contain processing failures due to damages to the projection mask, and to realize stable processing.

Third Embodiment

In this embodiment, we will describe a FIB device for detecting anomalies in ion beams according to the present invention.

In the First Embodiment and the Second Embodiment, we described the example of PJIB. However, similar detection of ion beam can be realized in the case of FIB also. The FIB device shown in FIG. 20 includes a movable specimen stage 2102 for placing the specimen substrate of a specimen 2101 such as semiconductor wafer and the like, a specimen-stage position controller 2103 for controlling the position of a specimen stage 2102 for specifying the observation and fabricating position of the specimen 2101, an ion-beam irradiating optical system 2105 for irradiating the specimen 2101 with ion beam 2104 and fabricating the same, and a secondary-electron detector 2106 for detecting the secondary electrons coming from the specimen 2101. The secondary-electron detector 2106 is controlled by a controller 2107 for secondary-electron detector. An assisting gas supplying source 2108 for supplying the assist gas used for ion beam assist deposition and ion beam assist etching is controlled by a controller 2109 for assisting gas supplying source. And a probe 2110 for extracting the specimen for processing and measuring electric characteristics is controlled by a probe controller 2111. The controller 2107 for secondary-electron detector, the controller for assisting gas supplying source 2109, the specimen-stage position controller 2103, the probe controller 2110, or the controller of various constituent elements of the ion-beam irradiating optical system 2105 mentioned further below and the like are controlled by the central processing unit 2112. For example, as the central processing unit 2112 mentioned here, a personal computer, a work station and the like are generally used. And the specimen stage 2102 provided with a monitor 2113, the ion-beam irradiating optical system 2105, the secondary-electron detector 2106, the assisting gas supplying source 2108 and the like are disposed in the vacuum chamber 2114. By this configuration, the specimen 2101 placed on the specimen stage 2102 are irradiated with the ion beams 2104 generated by the ion-beam irradiating optical system 2105 to be fabricated.

We will then describe in details the ion-beam irradiating optical system 2105. Ion is generated by the ion source 2116, which is controlled by the ion source controller 2117. This embodiment shows the case of plasma ion source. As the plasma ion source, it is possible to use various ion sources such as duoplasmatron, inductively coupled plasma ion source, Penning ion source, multicusp ion source, and the like. These plasma ion sources are mainly used as the ion source of gas materials such as oxygen, nitrogen, rare gas and the like. In addition to the plasma ion sources, electrolytic ionized ion source and the like are used as the ion sources of gas materials. And liquid metal ion sources and the like are used as the ion source of metal materials, and for this device various ion sources can be used. Ion is extracted as ion beams through the extractor 2118. The extracted ion beam is focused on the specimen 2101 by an illumination lens 2120 controlled by an illumination lens power source 2119 and an objective lens 2122 controlled by an objective lens power source 2121.

In other words, in this FIB configuration, the illumination lens 2120 and the objective lens 2122 in two stages are used with the condition that the image may be formed at the point where the ion beam is focused most sharply on the ion source side of the illumination lens 2120. Incidentally, the above-mentioned point where the ion beam is focused most sharply is, for example in the case of plasma ion source and the like, the aperture of anode, in the case of the example described in the Second Embodiment, the aperture of the ion source limiting mask and the like, or in the case of liquid metal ion source or electrolytic ionized ion source, the ion discharge point. And in the case of the plasma ion source, in addition to the formation of image by the 2-stage lens constituted by the illumination lens and the objective lens, there is a method of forming image on the specimen by the objective lens 2122 from the cross-point of ion beam formed by the illumination lens 2120.

And an important difference from the PJIB is that the processing form of the specimen is not determined by the aperture form of the projection mask, but determines the irradiation position of ion beams for processing by scanning the specimen as described above with ion beams focused in a spot by means of the main deflector 2124 controlled by the main deflector controller 2123. As a result, it is possible to process according to any optional form. In this FIB device, the beam limiting aperture 2115 made with a plate member having an aperture is used to determine the ion beam spot diameter and the ion beam current value on the specimen. In other words, this device normally has a plurality of circular apertures of different diameters, and a variety of processing can be realized by switching them by means of the beam limiting aperture driver 2126 controlled by the beam limiting aperture controller 2125. Large apertures are used to process at a high speed using a large current at the cost of a lower precision of processing because of a large diameter, and smaller apertures are used to process at a low speed because of a small current but with a high precision because of small beam diameter. And it is possible to acquire the SIM image of the surface of the specimen 2101 by scanning the specimen with the deflector 2124, detecting the secondary electrons generated as a result of the scanning with the secondary-electron detector 2106, and by taking the same as contrast signals and transforming them into image on the monitor 2113.

Figure 20:
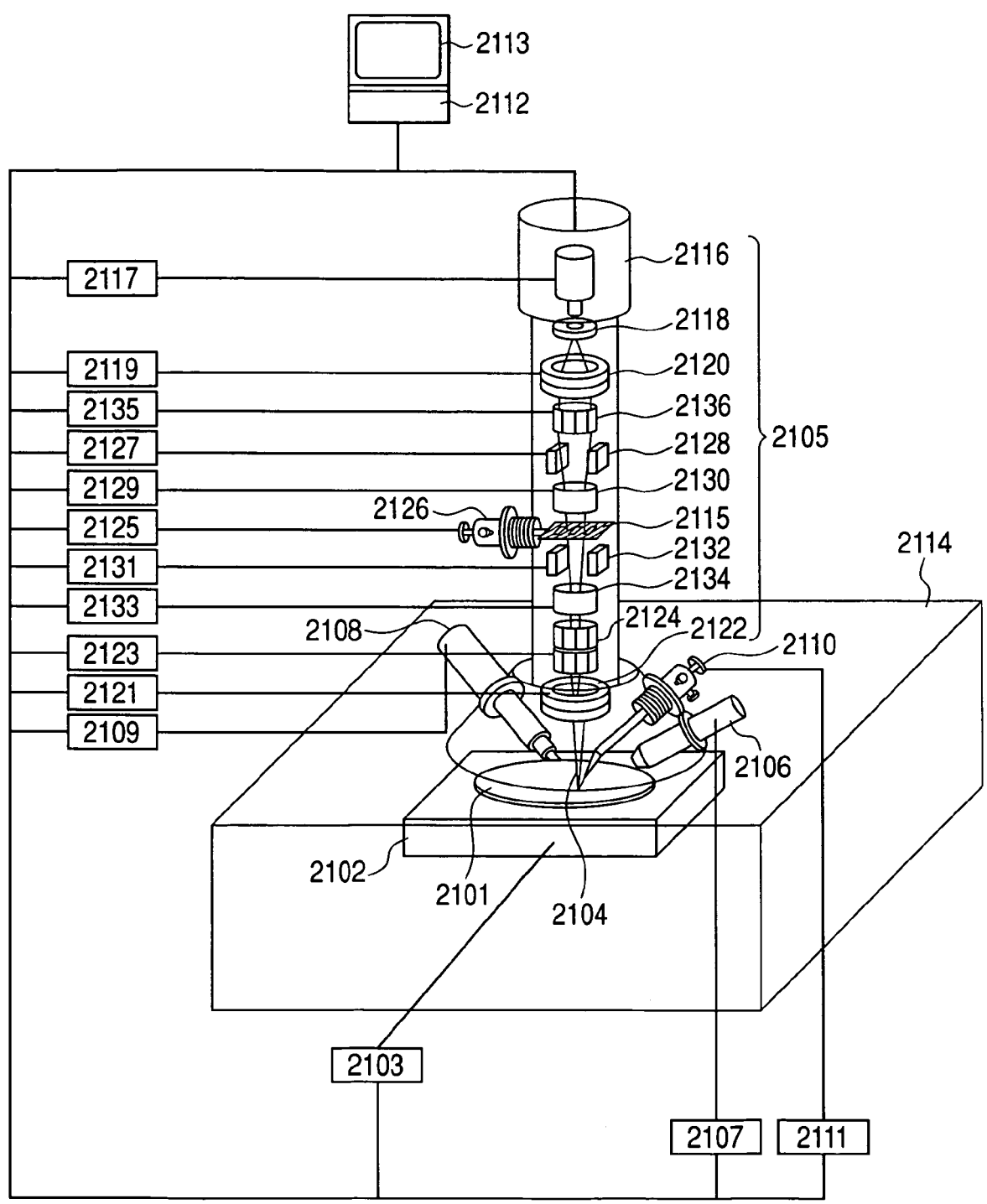
FIG. 20 is a drawing showing an example of configuration of a FIB device which is the Third Embodiment of the present invention.

Here, as shown in FIG. 20, like the First and Second Embodiments, this configuration includes the first blanker 2128 controlled by the first blanker controller 2127, the first Faraday cup 2130 connected with the first Faraday cup ammeter 2129 above this beam limiting aperture 2115, and the second blanker 2132 controlled by the second blanker controller 2131 and the second Faraday cup 2134 connected with the second Faraday cup ammeter 2133 below the beam limiting aperture 2115. And the deflector 2136 controlled by the deflector controller 2135 is provided above the beam limiting aperture 2115. Since the ion beam current above and below the beam limiting aperture 2115 can be respectively monitored by this configuration, it is also possible to obtain the same effect as the detection of a failure shown in the First Embodiment and the Second Embodiment with this FIB device.

By using the ion beam fabricating device described in this embodiment, it is possible to detect ion beam failure, sort out the cause, compensate the failure and accordingly to reduce processing failures and to realize stable processing by the FIB device.

We have described above an example of applying ion beams. However, since it is possible to realize similar adjustments of beam directed towards any aperture by applying electron beams, similar effects can be obtained from SEM and other charged particle beam devices.

As we have described in details above, the present invention displays its full effect in testing and analyzing semiconductor processes, can be used therefore to improve yield at semiconductor processing plants and contributes considerably to the reduction of costs.

What is claimed is:

1. An apparatus for ion beam fabrication comprising:
a specimen stage for holding a specimen;
an ion source for generating ion beams having an ion beam optical axis;
a plate member having an aperture; and
an irradiating optical system for irradiating the specimen held on said specimen stage with ion beams having penetrated said aperture, wherein
said irradiating optical system comprises a blanker and a current detector on the ion source side of the plate member, and switches ON said blanker to monitor current with said current detector when it is not necessary to irradiate said specimen with said ion beam, wherein
said current detector is a Faraday cup which is inserted in said ion beam optical axis.

2. The apparatus for ion beam fabrication according to claim 1, wherein the plate member having said aperture is a projection mask having a pattern aperture.

3. The apparatus for ion beam fabrication according to claim 1, further comprising:
a monitor, wherein
said monitor displays a failure or a handling manual when current flowing in said beam current detector has fluctuated widely exceeding the limits of current value set in advance.

4. An apparatus for ion beam fabrication comprising:
a specimen stage for holding a specimen;
an ion source for generating ion beams having an ion beam optical axis;
a plate member having an aperture; and
an irradiating optical system for irradiating the specimen held on said specimen stage with ion beams having penetrated said aperture, wherein
said irradiating optical system comprises a first blanker and a first current detector on the ion source side, and a second blanker and a second current detector on the specimen side of said aperture wherein
said first current detector and said second current detector are Faraday cups which are inserted in said ion beam optical axis.

5. The apparatus for ion beam fabrication according to claim 4, wherein said first blanker is switched ON to monitor current with said first beam current detector when it is not necessary to irradiate said specimen with said ion beams, switches OFF said first blanker and switches ON said second blanker immediately before irradiating said specimen with said ion beam to monitor current with said second current detector.

6. The apparatus for ion beam fabrication according to claim 4, wherein the plate member having said aperture is a projection mask having a plurality of pattern apertures.

7. The apparatus for ion beam fabrication according to claim 6, further comprising:
a monitor, wherein
the apparatus displays the current value of said first beam current detector and the current value of said second beam current detector on said monitor.

8. The apparatus for ion beam fabrication according to claim 7, wherein the time for replacing said projection mask is displayed on said monitor by comparing the time calculated from the current value of said first beam current detector and the irradiation time of ion beams on said pattern aperture.

9. The apparatus for ion beam fabrication according to claim 7, wherein said monitor displays a failure or a manual for dealing therewith when the current of said first beam current detector fluctuates widely exceeding the limits of current set in advance.

10. The apparatus for ion beam fabrication according to claim 7, wherein said monitor displays a failure of said projection mask or a manual for dealing therewith when the current of said first beam current detector is within the limits set in advance of current values and the current of said second beam detector fluctuates widely exceeding the limits of current set in advance.

11. The apparatus for ion beam fabrication according to claim 6, wherein said first blanker and second blanker are switched OFF altogether during a period of time calculated from the current value of said second beam current detector and the aperture area of said pattern aperture registered in advance.

12. The apparatus for ion beam fabrication according to claim 6, comprising:
a deflector disposed on the ion source side of said projection mask,
wherein said deflector is set to the beam deflection condition under which the current of said second beam current detector may be within the limits of current value set in advance, when the current of said first beam current detector is within the limits of current value set in advance and the current of said second beam current detector is smaller than the current value set in advance.

13. The apparatus for ion beam fabrication according to claim 6, wherein said projection mask comprises pinhole apertures formed, a deflector disposed on the ion source side of said projection mask and a mask driver for selectively switching said plurality of pattern apertures and said pinhole apertures present in said projection mask under the irradiation of said ion beams, deflects said ion beams for scanning by applying deflection scanning signals to said deflector and acquires the beam profile of said ion beam from the current value of said second beam current detector and said deflection scanning signal.

14. The apparatus for ion beam fabrication according to claim 13, wherein said deflector is set in the condition of beam deflection wherein the maximum current range of said beam profile falls in the position of said pinhole apertures, when the current of said second beam current detector is smaller than the current value set in advance within the limits of current value set in advance by the current of said first beam current detector.

15. The apparatus for ion beam fabrication according to claim 4, an output unit for outputting failure information when the current of said first current detector has fluctuated widely exceeding the limits of current value set in advance.

16. The apparatus for ion beam fabrication according to claim 4, comprising:
an output unit for outputting failure information when the current of said first current detector is within the limits of current value set in advance and the current of said second current detector is larger than the current value set in advance.

* * * * *